United States Patent
Sanglap et al.

(10) Patent No.: US 11,394,346 B2
(45) Date of Patent: Jul. 19, 2022

(54) MAGNETIC COUPLING FRAME PV MODULE WITH BATTERY AND METHOD OF USING THE SAME

(71) Applicant: IMPOWER ENERGY, INC., Lowell, MA (US)

(72) Inventors: Roland T. Sanglap, Beverly, MA (US); Matthew C. Noonan, Beverly, MA (US)

(73) Assignee: IMPOWER ENERGY, INC., Lowell, MA (US)

( * ) Notice: Subject to any disclaimer, the term of this patent is extended or adjusted under 35 U.S.C. 154(b) by 51 days.

(21) Appl. No.: 16/797,856

(22) Filed: Feb. 21, 2020

(65) Prior Publication Data

US 2020/0274483 A1 Aug. 27, 2020

Related U.S. Application Data

(60) Provisional application No. 62/808,425, filed on Feb. 21, 2019.

(51) Int. Cl.
*H02S 40/34* (2014.01)
*H01R 13/62* (2006.01)
*H02S 30/10* (2014.01)
*H02S 40/38* (2014.01)

(52) U.S. Cl.
CPC ......... *H02S 40/34* (2014.12); *H01R 13/6205* (2013.01); *H02S 30/10* (2014.12); *H02S 40/38* (2014.12)

(58) Field of Classification Search
CPC ....... H01L 31/048; H02S 30/10; H02S 40/30; H02S 40/34; H02S 40/36; H02S 40/38; H01R 13/6205
See application file for complete search history.

(56) References Cited

U.S. PATENT DOCUMENTS

| | | | |
|---|---|---|---|
| 9,985,384 B1 * | 5/2018 | Johnson | H01R 13/73 |
| 2008/0194154 A1 * | 8/2008 | Minnick | H02S 40/34 439/842 |
| 2013/0284243 A1 * | 10/2013 | Jeong | H01L 31/0504 136/251 |
| 2014/0014164 A1 * | 1/2014 | Song | H01L 31/042 136/251 |
| 2014/0090694 A1 * | 4/2014 | Bolanos | H02S 40/36 136/251 |
| 2017/0170776 A1 * | 6/2017 | Janowski | H02S 20/26 |
| 2019/0074795 A1 * | 3/2019 | Ehlmann | H02J 3/383 |

* cited by examiner

*Primary Examiner* — Mayla Gonzalez Ramos
(74) *Attorney, Agent, or Firm* — Greenberg Traurig, LLP; Chinh H. Pham; Joshua I. Rudawitz

(57) ABSTRACT

Described herein is an apparatus that allows for quicker assembly of photovoltaic array system. More particularly, the invention relates to photovoltaics, frame housing, magnetic coupling, array connectors, and battery unit within a photovoltaic module. Two connector types, male and female, will be in magnetic electrical contact. The male and female connectors will be fastened to individual photovoltaic panel framework with wiring internalized. Battery unit will be attached to the module. This configuration allows for quicker assembly of photovoltaic array system.

15 Claims, 26 Drawing Sheets

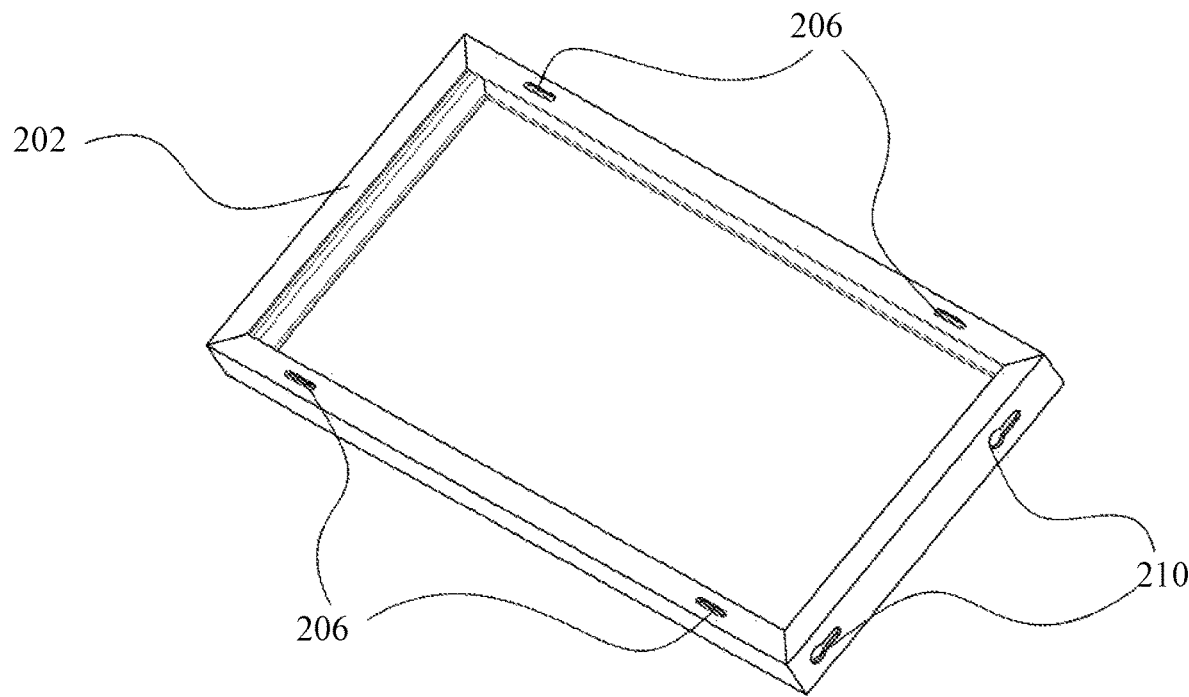
*Fig. 10C*
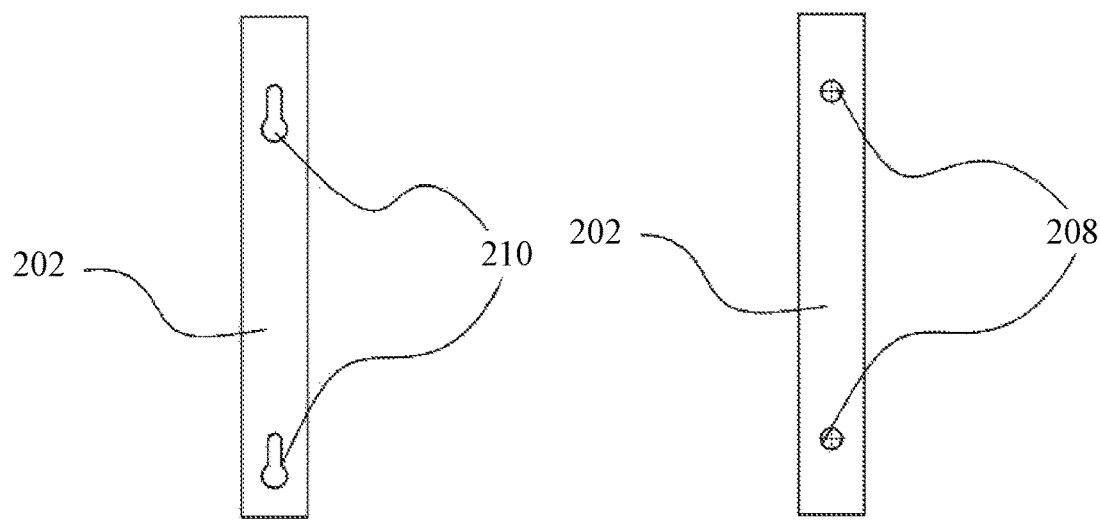
*Fig. 10D*  *Fig. 10E*

MAGNETIC COUPLING FRAME PV MODULE WITH BATTERY AND METHOD OF USING THE SAME

CROSS-REFERENCE TO RELATED APPLICATION(S)

This application claims priority to, and the benefit of, U.S. Provisional Application No. 62/808,425, filed Feb. 21, 2019, for all subject matter common to both applications. The disclosure of said provisional application is hereby incorporated by reference in its entirety.

FIELD OF THE INVENTION

The present disclosure relates to systems and methods suitable for coupling photovoltaic (PV) cells together to create a solar power system. In particular, the present disclosure relates to PV panels that can be easily electronically coupled to one another without array and roof wiring.

BACKGROUND

Over the past several years, solar power technology has advanced significantly while also becoming less expensive. Photovoltaic (PV) solar panels, in particular, have become extremely popular. As PV array systems become more comprehensive, and the number of functions executed by a given array system increase, it has become a significant challenge to design a PV array system that allows ease of installation and use combined into one streamlined solar PV system.

Traditionally, PV array systems have complex wiring sequences that increase safety risks and may contribute to reliability issues. A major risk is potential-induced degradation (PID) which is potential-induced performance degradation in crystalline photovoltaic modules, caused by multiple stray currents. This effect may cause power loss of up to 30 percent. The aforementioned challenges are particularly significant for home solar PV systems.

Residential solar PV systems (e.g., PV system, sometimes called solar power system, photovoltaic system, solar array, and the like) have also resorted to adding more solar panel wire or PV wire, increasing the concentration of wiring connections, overloading the roof wiring which creates a potential fire hazard, or using complex wiring systems to allow further connectivity for larger PV systems but creates potential for wiring system breakdown and malfunction.

SUMMARY

There is a need for improvements for how Photovoltaic (PV) are installed and operate. The present disclosure provides, in various embodiments solutions to address this need, in addition to having other desirable characteristics. Specifically, the present disclosure provides a quick magnetic coupling PV frame module with a battery that substantially or entirely eliminates array wiring, on roof wiring, and a connection from internal solar cells to external junction box.

In accordance with example embodiments of the present invention, a photovoltaic solar system is provided. The system includes a frame designed to accommodate a solar panel for converting solar energy, at least one conductive connector extending from the frame, and a pathway along the at least one conductive connector and the frame and through which the converted solar energy can be directed.

In accordance with aspects of the present invention, the solar panel comprises a plurality of photovoltaic cells for collecting energy and a photovoltaic output junction wired to each of the plurality of photovoltaic cells. The system can further include a battery casing having at least one battery and a battery input coupled to the photovoltaic output junction for receiving energy from the photovoltaic output junction for storage in the at least one battery. The battery casing can further include a plurality of battery outputs configured to couple to the at least one conductive connector. The frame can include a plurality of mounting openings for mounting to a structure or a sub-frame. The sub-frame can couple to the plurality of mounting openings of the frame. The sub-frame can further include a plurality of mounting, a plurality of male rivets, and a plurality of female rivet slots.

In accordance with aspects of the present invention, the at least one conductive connector can include at least one female connector including a head coupled to a shank, a magnetic material positioned within a recess of the head, a conductive material extending through the head and the shank, and an insulating material positioned between the conductive material and the head and the shank. The shank can be threaded and is substantially cylindrical in shape for removable insertion into a plurality of connection openings and a diameter of the head is greater than a diameter of the plurality of connection openings such that the head limits a penetration of the at least one female connector into the plurality of connection openings.

In accordance with aspects of the present invention, the at least one conductive connector can include at least one male connector, including a head coupled to a shank, a conductive material extending through the head and the shank, and an insulating material positioned between the conductive material and the head and the shank. The at least one male connector can further include an O-ring positioned circumferentially around the head. The head can further include a lip with a diameter greater than a diameter of a plurality of connection openings such that the lip limits a penetration of the at least one male connector into the plurality of connection openings. The shank can be threaded and is substantially cylindrical in shape with a substantially flat surface for insertion into the plurality of connection openings. The system can further include a plurality D-shaped connection openings.

In accordance with example embodiments of the present invention, electrical coupling is provided. The electrical coupling includes a male magnetic connector having a male head coupled to a male shank and a first conductive material extending through the male head and the male shank. The electrical coupling also includes a female magnetic connector having a female head coupled to a female shank, the female head having a recess and designed to accommodate the male head, a magnetic material positioned within the recess of the female head, and a second conductive material extending through the female head and the female shank.

In accordance with aspects of the present invention, the coupling further includes an insulating material positioned between the conductive material and the male head, the male shank, the female head, and the female shank. The at least one male connector can further include an O-ring positioned circumferentially around the male head and a lip with a diameter greater than a diameter of the shank such that the lip limits a penetration of the at least one male connector into the plurality connection openings. The male head can be sized and dimensioned to substantially fill the recess of the female head. The male shank and female shank can be threaded substantially cylindrical shapes with a substantially flat surface.

In accordance with example embodiments of the present invention, method of assembling a PV module is provided. The method includes coupling a photovoltaic cell casing to a frame having a plurality of connection openings, inserting a battery casing within the frame and electrically coupling the battery casing to the photovoltaic cell casing, inserting at least one male connector into a first of the plurality of connection openings, inserting at least one female connector into a second of the plurality of connection openings, and creating an electrical pathway between the at least one male connector and the at least one female connector by coupling the at least one male connector and the at least one female connector to the battery casing.

In accordance with example embodiments of the present invention, method for transferring energy in a photovoltaic system is provided. The method includes converting, by photovoltaic cells within a photovoltaic cell casing of a first photovoltaic module, solar energy received on a solar panel, transferring the converted solar energy from the photovoltaic cell casing to a battery casing of the first photovoltaic module, storing the converted energy in a battery in the battery casing of the first photovoltaic module, and transferring, over a conductive pathway including a coupled female magnetic connector and male magnetic connector, the stored energy to a battery casing of a second photovoltaic module positioned adjacent to the first photovoltaic module.

BRIEF DESCRIPTION OF THE FIGURES

These and other characteristics of the present disclosure will be more fully understood by reference to the following detailed description in conjunction with the attached drawings, in which:

FIG. 10C is a rear isometric illustrative view of one example of a sub-frame according to various embodiments of the present disclosure;

FIGS. 10D and 10E are side illustrative views of one example of a sub-frame according to various embodiments of the present disclosure;

DETAILED DESCRIPTION

Figure 1A:
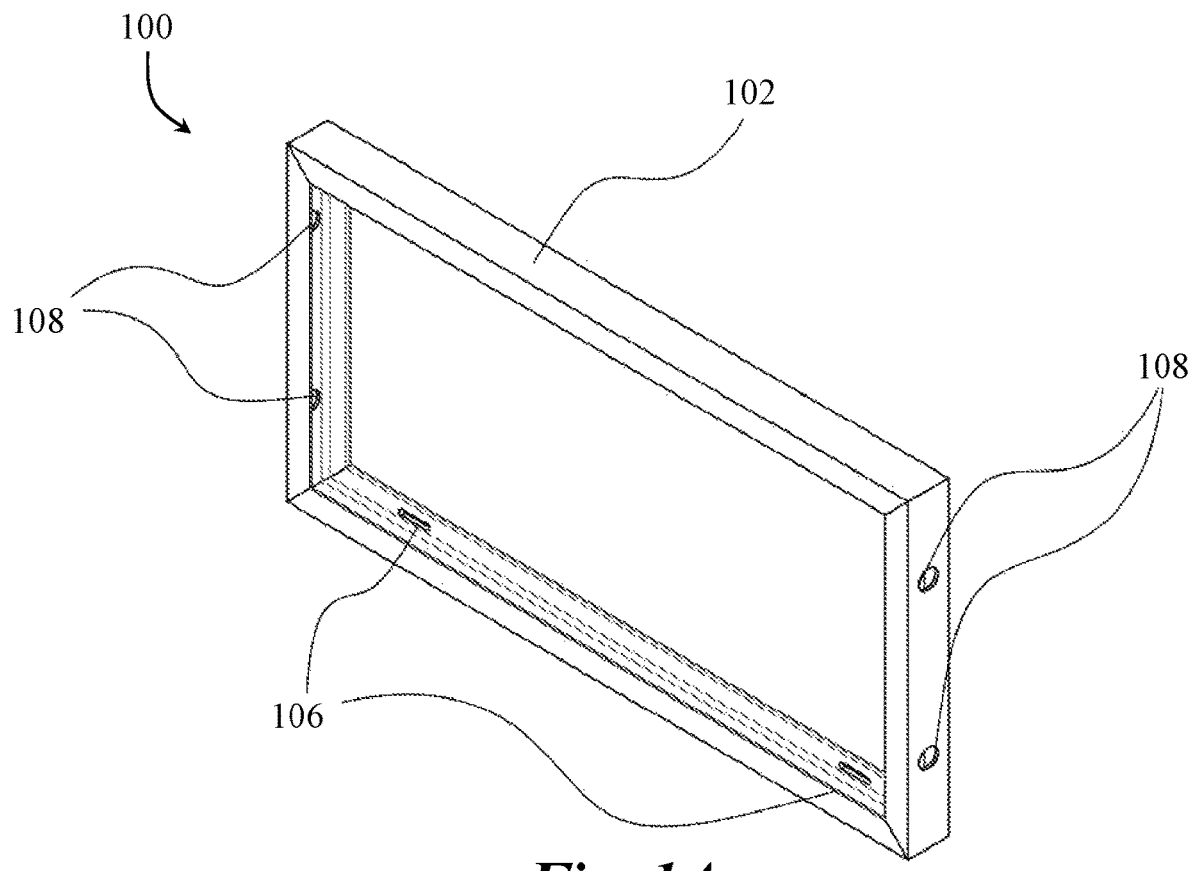
FIG. 1A is a front isometric illustrative view of one example of a frame according to various embodiments of the present disclosure.

An illustrative embodiment of the present disclosure relates to systems and methods for coupling photovoltaic (PV) cells (or other form of solar cells) efficiently without the need for excessive wiring typically required for PV systems. The present invention provides a design which enables PV modules that can quickly couple to one another through magnetic connections while establishing electronical connections with adjacent PV modules. Although the present disclosure references PV systems in example embodiments, any combination of solar energy systems can be used within the scope of the present disclosure.

FIGS. 1A through 12D, wherein like parts are designated by like reference numerals throughout, illustrate an example embodiment or embodiments of improved operation for improve PV system installation and operation, according to the present disclosure. Although the present disclosure will be described with reference to the example embodiment or embodiments illustrated in the figures, it should be understood that many alternative forms can embody the present disclosure. One of skill in the art will additionally appreciate different ways to alter the parameters of the embodiment(s) disclosed, such as the size, shape, or type of elements or materials, in a manner still in keeping with the spirit and scope of the present disclosure. Although the present disclosure refers to the use of photovoltaic (PV) cells in example embodiments, any combination of solar or other energy harvesting devices can be used with the design of the present disclosure without departing from the scope of the present disclosure.

Figure 1B:
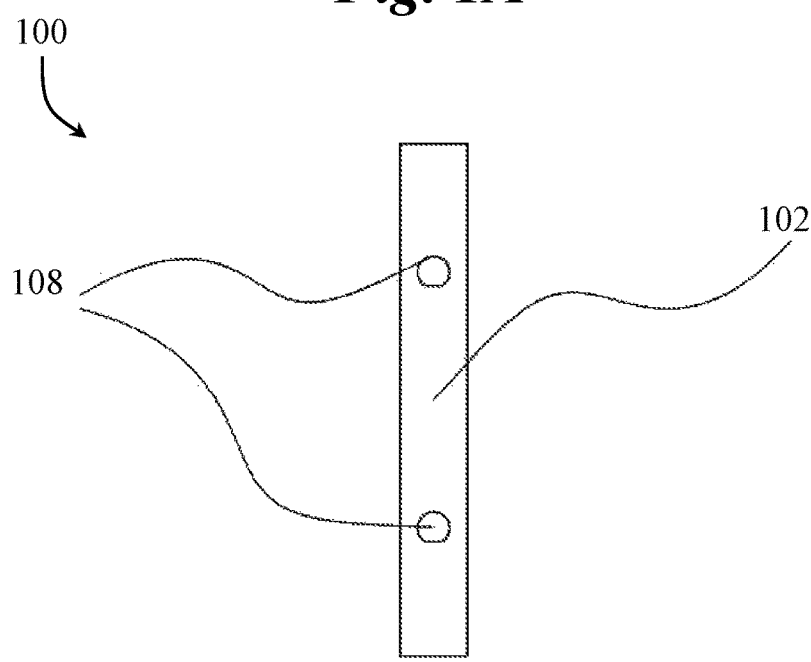
FIG. 1B is a side illustrative view of one example of a frame according to various embodiments of the present disclosure.

Referring to FIGS. 1A-1F, example views of various components for a PV module 100 are depicted. In some embodiments, the PV module 100 can include a frame 102 for providing means to mount the PV module 100 to a structure while housing and/or accommodating a solar panel 104 or solar cell and other electrical components. FIG. 1A provides an example isometric view of the frame 102 and FIG. 1B provides an example side view of the frame 102. The frame 102 can be constructed from any combination of materials suitable for installation in an outdoor environment to withstand environmental conditions. For example, the frame 102 can be constructed from any combination of metal, plastic, lightweight alloys, or any other suitable materials. Similarly, the frame 102 can be sized and shaped to fit any combination of installations and house any combination of components used in PV systems. For example, the frame 102 can be rectangular in shape sized to receive a solar panel 104, as depicted in FIGS. 1A-1F. In other words, the frame 102 can be sized and shaped to couple to and/or be encased around an outside edge of the solar panel 104 and house its related components.

In some embodiments, the frame 102 can be designed to receive and provide a housing for a combination of components to form an operating PV module 100. For example, as depicted in FIGS. 1A-1F, the frame 102 can include front and rear lips extending substantially perpendicularly from the outside frame walls to couple to and/or provide a housing for the solar panel 104 and other elements of a PV module 100 (e.g., battery, wiring, etc.), as discussed in greater detail herein. The frame 102, in conjunction with the other components of the PV module 100, can be designed to provide an airtight/watertight compartment to protect electrical and other components from weather and/or tampering. For example, the frame 102 can provide the base for receiving components such as the solar panel 104 and a battery casing 160 to create a sealed PV module enclosure. When the aforementioned embodiments are initiated the frame 102 can be transformed into a sealed solar PV module 100 with battery storage that can connect and couple with another sealed solar PV module 100 with battery storage, as depicted in FIGS. 12A, 12B, 12C and 12D.

Figure 1C:
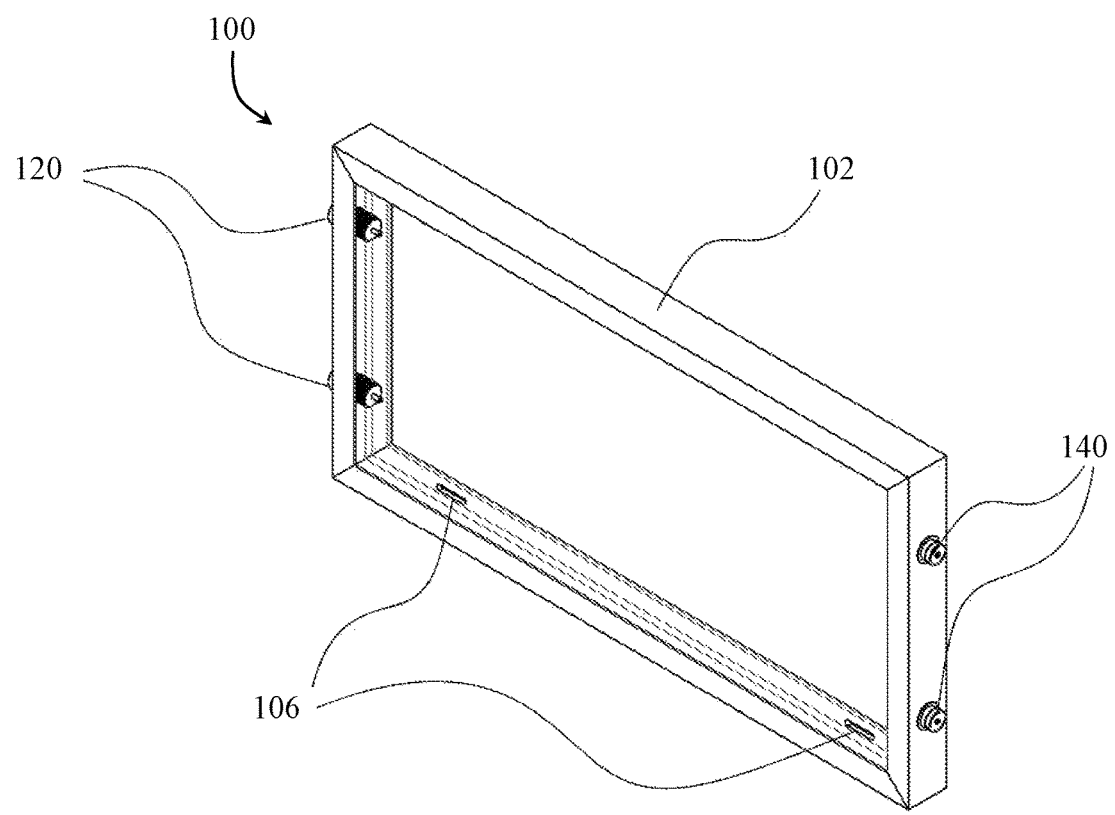
FIG. 1C is a rear isometric illustrative view of one example of a frame according to various embodiments of the present disclosure.

In some embodiments, at least one face of the frame 102 can include a plurality of mounting openings 106 designed to couple PV module 100 to a structure and/or a frame (e.g., frame 202) currently mounted or to be mounted on a structure (not depicted). For example, the frame 102 can include a plurality of mounting openings 106 for coupling the PV modules 100 to a mounting frame 202, as discussed in greater detail with respect to FIGS. 12A-12D. The plurality of mounting openings 106 can be used to mount the frame 102 to another object or structure using a fastener, for example, a nut and bolt. Alternatively, the plurality of mounting openings 106 can be used to mount the PV module 100 to a structure using for example, standoffs or other mounting mechanisms. The plurality of mounting openings 106 can be designed for any combination of sized and shapes designed to receive a coupling mechanism (e.g., a fastener). For example, as depicted in FIGS. 1A, 1C, and 1E, the plurality of mounting openings 106 can be elongate slots to provide flexible installation options. The frame 102 can also include other mechanisms for mounting the frame 102 to another structure, for example, using some combination of mechanical couplers, adhesives, welding, etc.

Figure 8A:
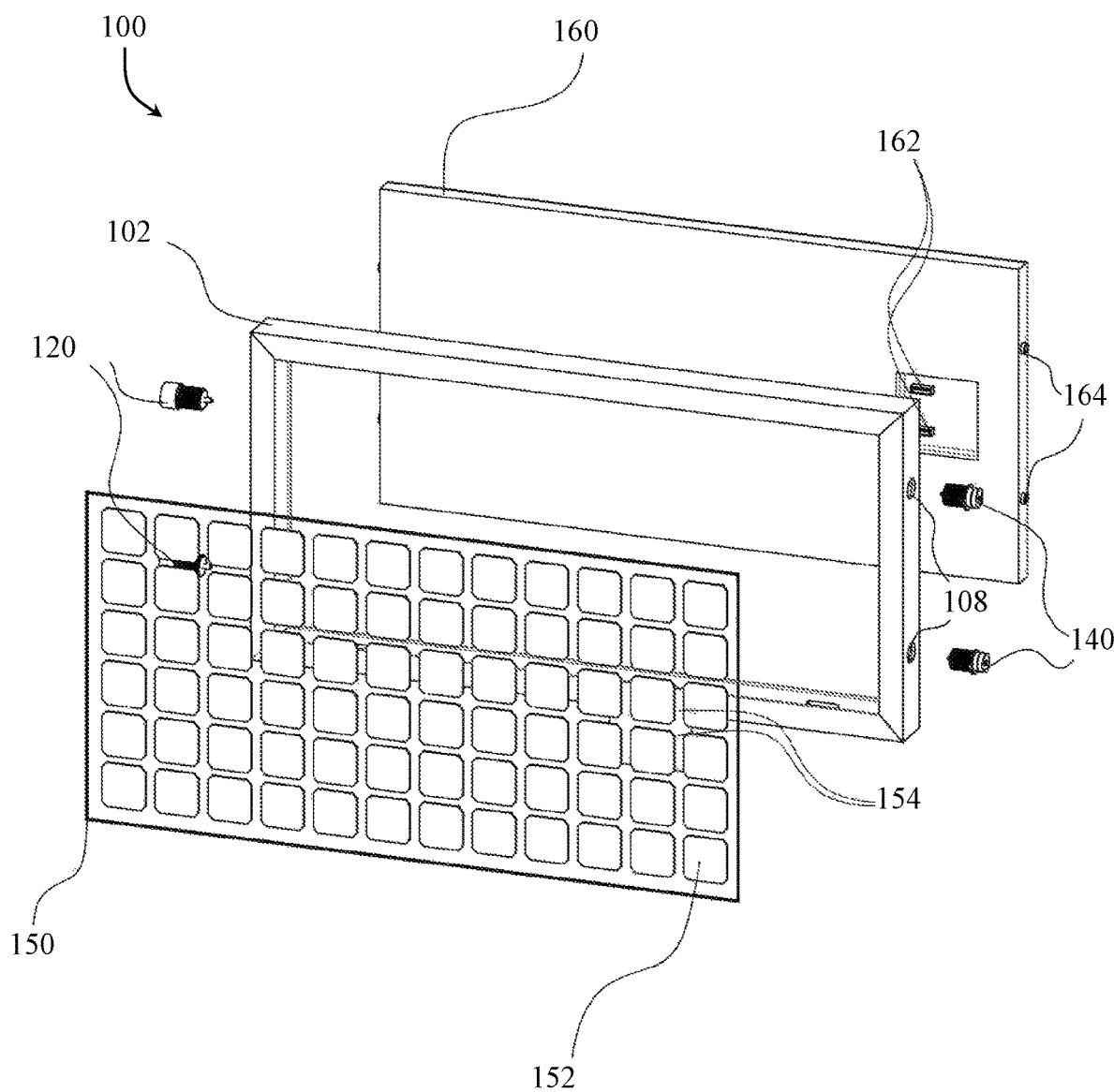
FIGS. 8A and 8B are exploded isometric illustrative views of a PV module according to various embodiments of the present disclosure.
Figure 8B:
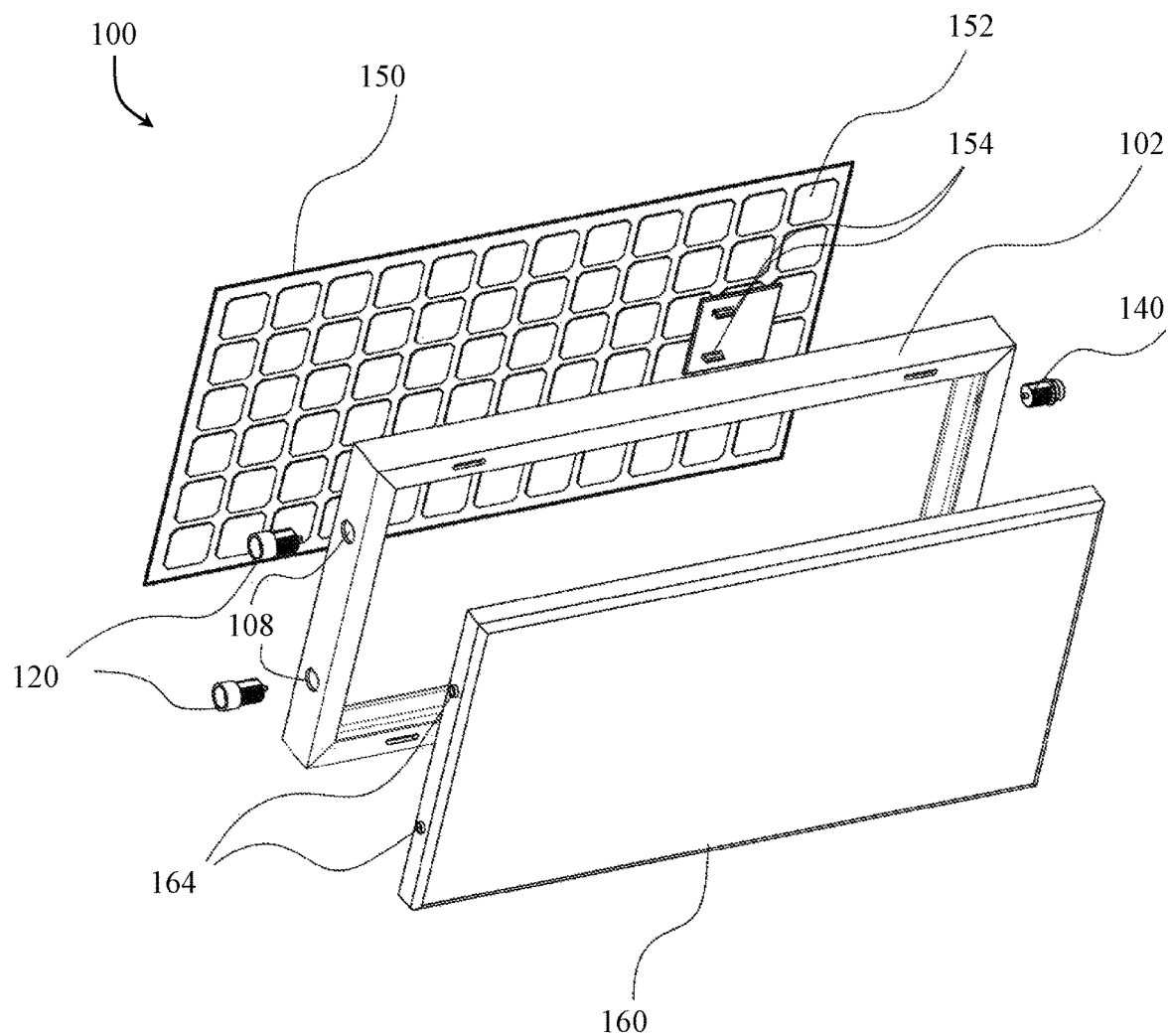

In some embodiments, the frame 102 can be designed to receive and/or be coupled to one or more solar panels 104. The solar panels 104 can be inserted within the frame 102, for example, within the perpendicular lips or it can be coupled to a face of the frame 102, as depicted in FIGS. 8A and 8B. Regardless of coupling location, the solar panels 104 can be secured to the frame 102 using any combination of mechanisms known in the art. For example, solar panels 104 can be coupled to a face of the frame 102 using or more fasteners through the plurality of mounting openings 106, for example, a nut and bolt. The frame 102 can also include other mechanisms for mounting the solar panels 104, for example, using some combination of mechanical couplers, adhesives, welding, magnetic couplers, etc. to couple the solar panel 104 within or on the face of the frame 102.

Continuing with FIGS. 1A-1E, in some embodiments, the frame 102 can be designed to receive one or more quick magnetic connectors 120, 140. In some embodiments, the frame 102 can include a plurality of connection openings 108 designed to receive the magnetic connectors 120, 140, which are designed to physically and electronically couple two PV modules 100 together. Each of the plurality of connection openings 108 can include any combination of sizes and shapes designed to establish a substantially tight fit with one of the magnetic connectors 120, 140 discussed in greater detail herein. The plurality of connection openings 108 can be symmetrically shaped or asymmetrically shaped and can be the same or different in shape for each of the corresponding magnetic connectors 120, 140. For example, as depicted in FIGS. 1A-1C, the plurality of connection openings 108 can be 'D' shaped openings sized to receive D-shaped connectors 120, 140. Similarly, any number of openings can be provided at different positions within the frame 102. In some embodiments, as depicted in FIGS. 1A-1C, the plurality of connection openings 108 can include two openings on each side of the frame 102, totaling four openings per frame 102. The four openings would enable the use of coupling two pairs of connectors 120, 140 therein. It should be appreciated that although two pairs of connectors are illustrated, any pair combination can be provided. Additionally, the plurality of connection openings 108 can be located at any combination of locations on the frame 102, for example, they can be located on the sides, top, bottom, or a combination thereof of the frame 102 and not limited to the locations provided in FIGS. 1A-1F.

Figure 1D:
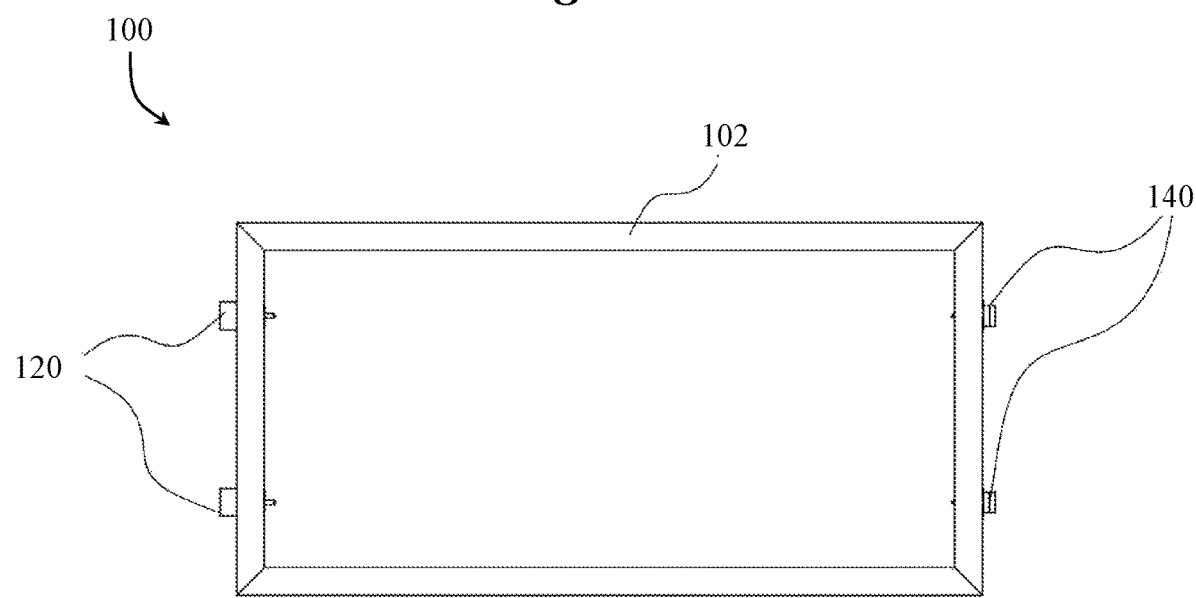
FIG. 1D is a front illustrative view of one example of a frame according to various embodiments of the present disclosure.
Figure 1E:
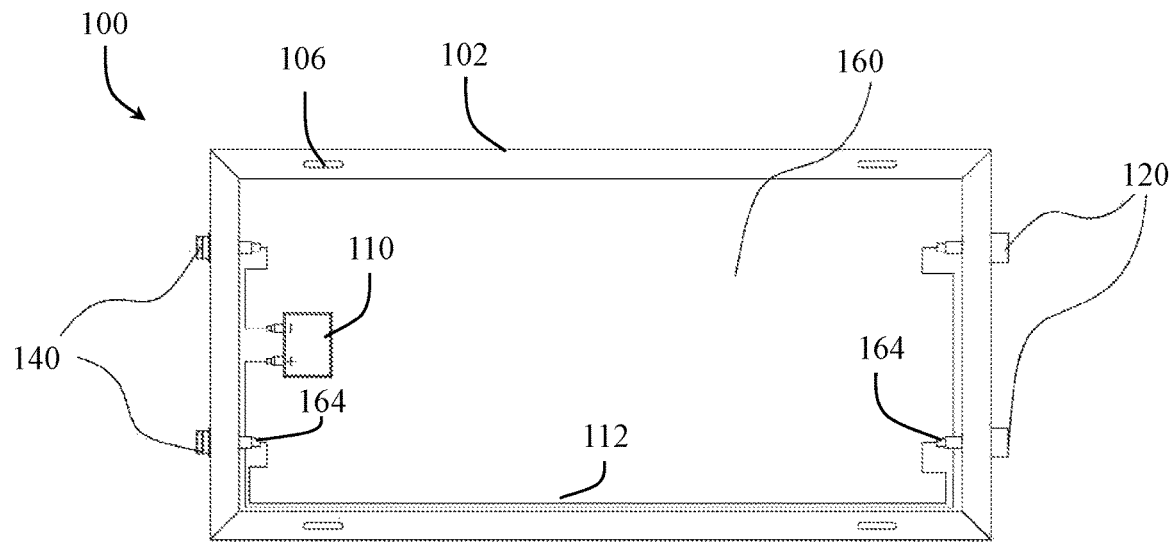
FIG. 1E is a rear illustrative view of one example of a frame according to various embodiments of the present disclosure.

Referring to FIG. 1C, an example isometric view of the PV module 100 with magnetic connectors 120, 140 inserted within the connection openings 108 is depicted, FIG. 1D provides an example front view of the PV module 100 with magnetic connectors 120, 140 inserted within the connection openings 108 and, FIG. 1E provides an example rear view of the PV module 100 with magnetic connectors 120, 140, including female magnetic connectors 120 and male magnetic connectors 140, inserted within the connection openings 108. In some embodiments, the connection openings 108 can be sized and shaped to match a shape of the magnetic connectors 120, 140 to provide a sufficiently tight fit to keep the magnetic connectors 120, 140 in place. For example, as depicted in FIGS. 1A-1E, the connection openings 108 can be D-shaped to receive D-shaped magnetic connectors 120, 140. Although D-shaped openings are provided as examples, any combination of shapes can be used without departing from the scope of the present disclosure. For example, the connection openings 108 can be can be round shaped and designed to received D-shaped magnetic connectors 120, 140.

In some embodiments, the frame 102 can include additional materials to provide an airtight/watertight seal between the inside of the completed PV module 100 and the outside at the location of the plurality of connection openings 108. For example, the frame 102 can include a rubber seal, gasket, O-rings, etc. to provide a compressible seal when the connectors 120, 140 are inserted and secured within the plurality of connection openings 108. The connectors 120, 140 can be fixedly attached within the connection openings 108 or removably and replaceable inserted within the connection openings 108.

Referring to FIG. 1E, in some embodiments, the frame 102 can be designed to electronically couple various components together. For example, the frame 102 can include and/or house a battery 110 and electrical wiring 112 to couple with the solar panel 104. Using the electrical wiring 112 and the battery, the frame 102 can provide a base electrical system for receiving emery from the solar panel 104, storing the energy within the battery 110, and/or transferring power to adjacent PV modules 100 via the magnetic connectors 120, 140. In some embodiments, the frame 102 can be designed to couple to and/or receive within its housing a self-contained electrical panel which houses the battery 110 and electrical wiring 112, as discussed in greater detail with respect to FIGS. 6A-6C. Regardless of implementation, with the electrical wiring 112 in place and the solar panel 104 coupled to the frame 102, a PV module 100 can be created.

Figure 1F:
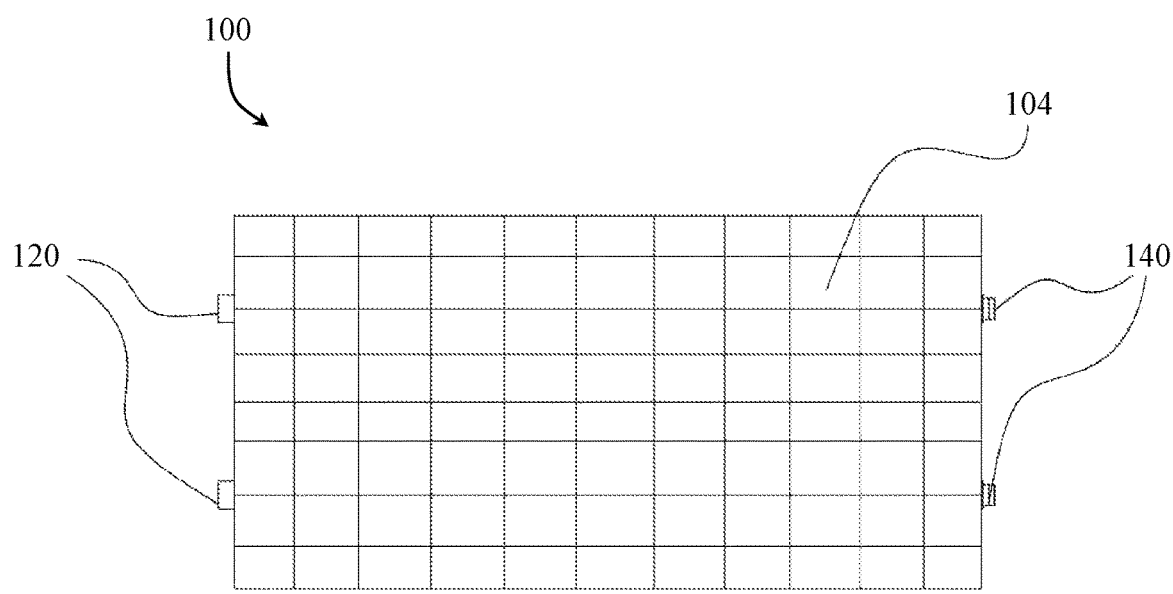
FIG. 1F is a front illustrative view of one example of a PV module according to various embodiments of the present disclosure.
Figure 2A:
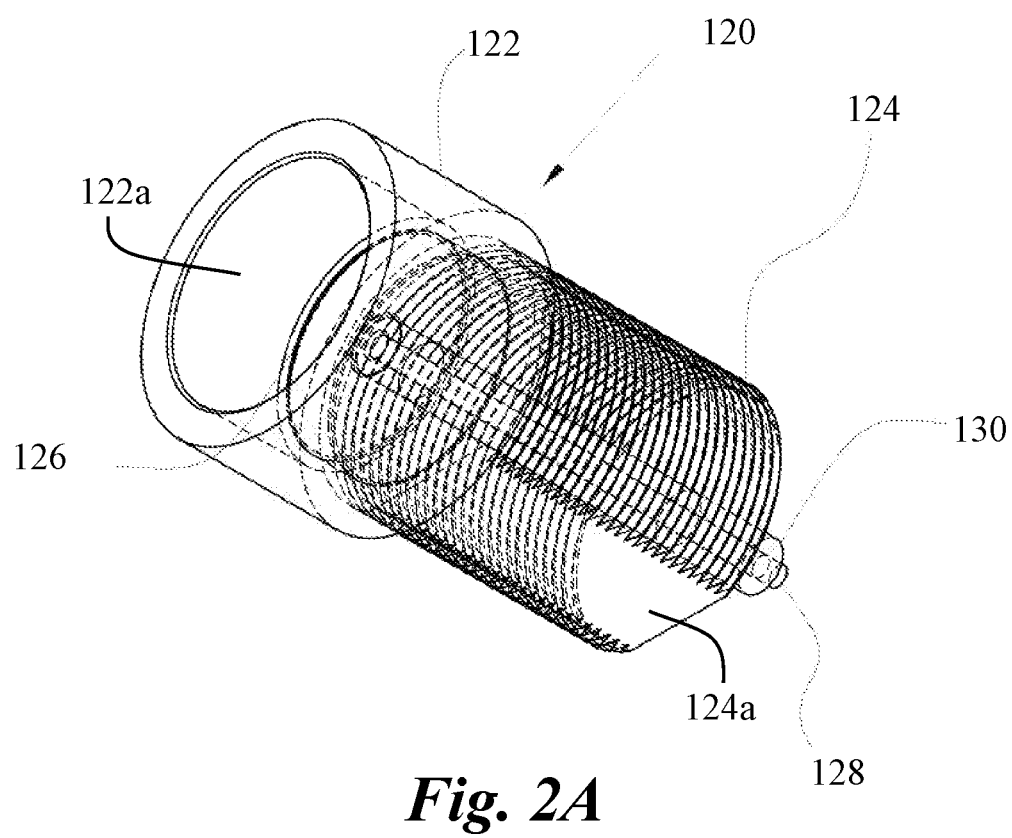
FIG. 2A is a front isometric hollow illustrative view of one example of a female magnetic connector according to various embodiments of the present disclosure.
Figure 2B:
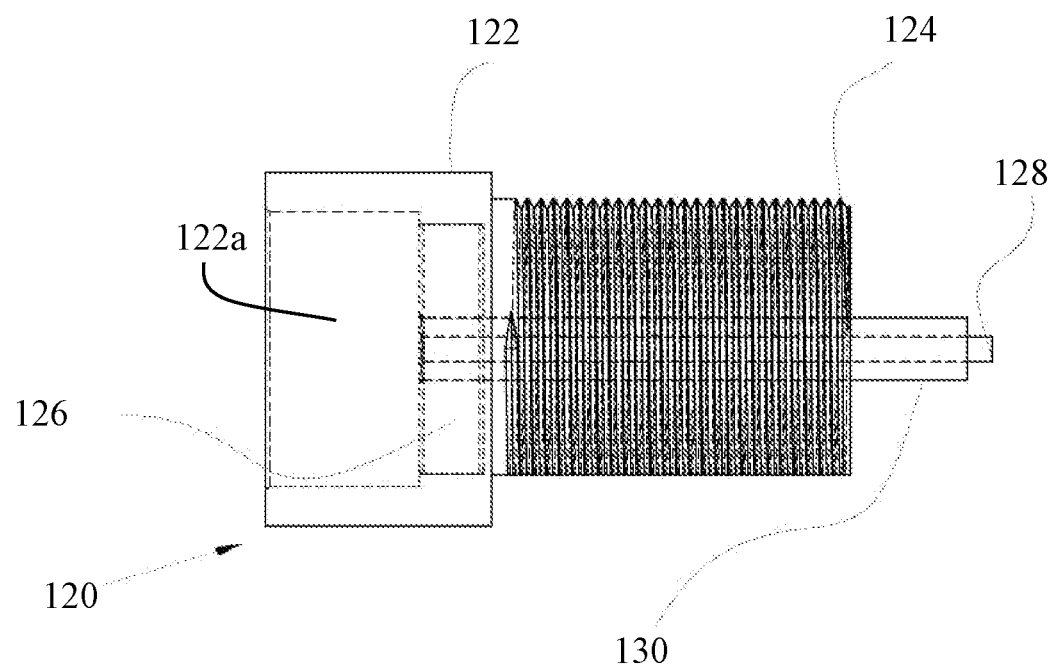
FIG. 2B is a side hollow illustrative view of one example of a female magnetic connector according to various embodiments of the present disclosure.
Figure 2C:
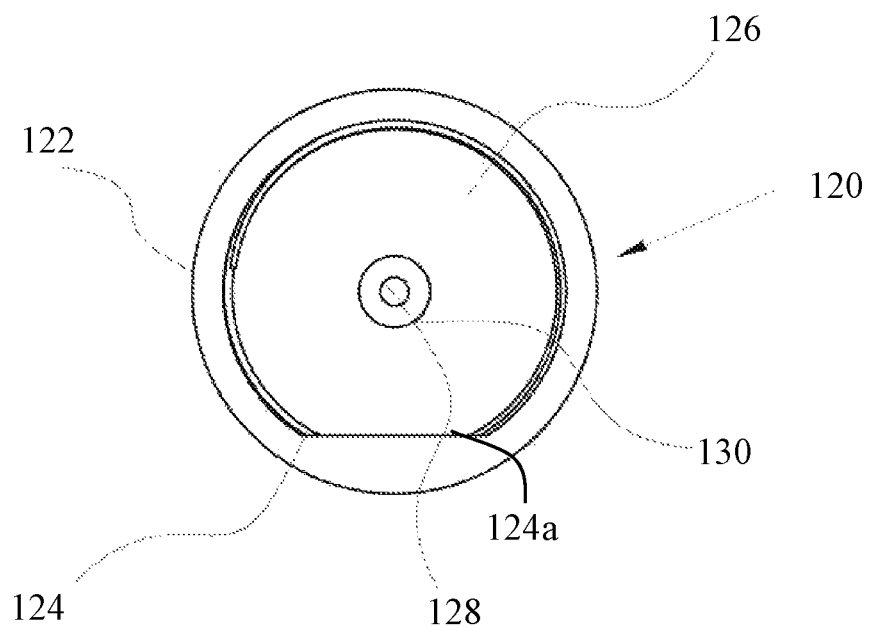
FIG. 2C is a rear illustrative view of one example of a female magnetic connector according to various embodiments of the present disclosure.
Figure 2D:
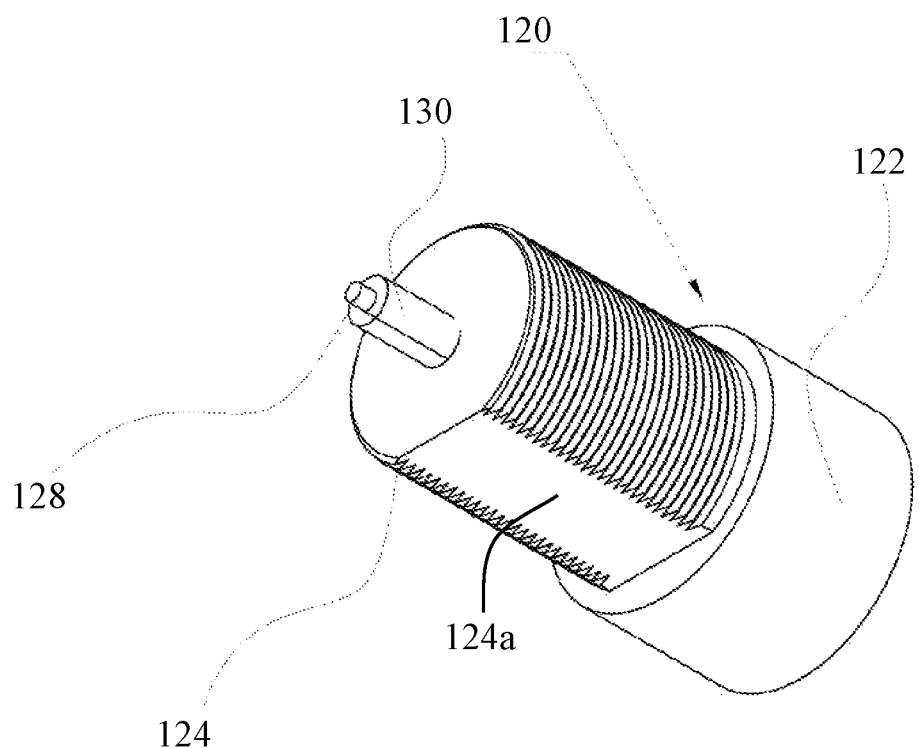
FIG. 2D is a rear perspective illustrative view of one example of a female magnetic connector according to various embodiments of the present disclosure.
Figure 2E:
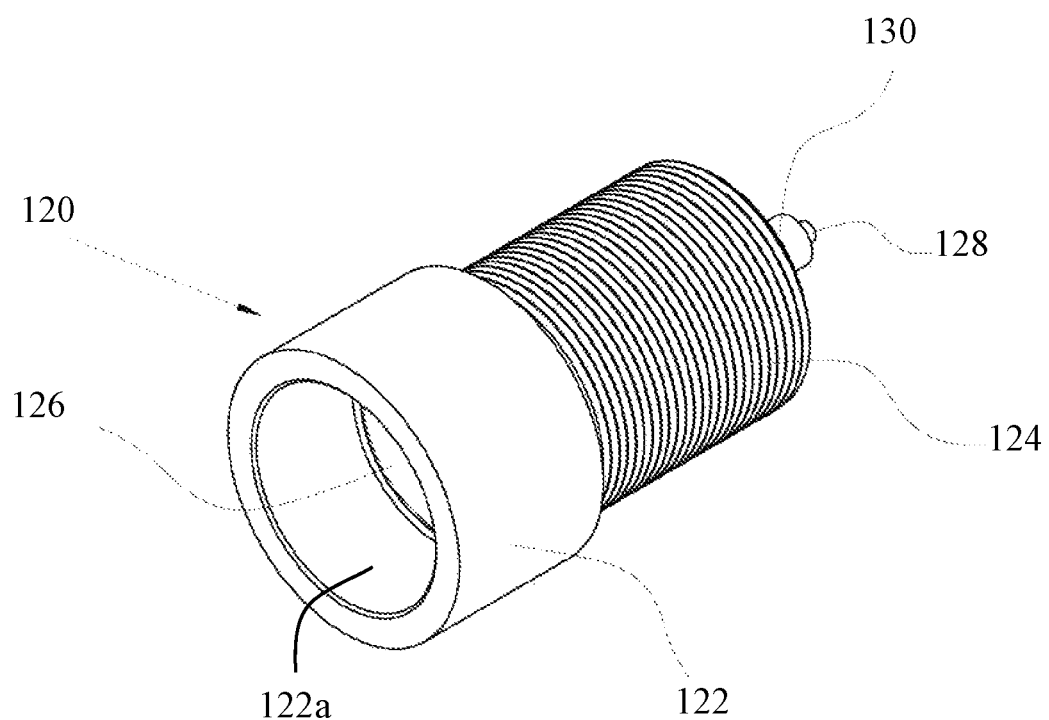
FIG. 2E is a front perspective illustrative view of one example of a female magnetic connector according to various embodiments of the present disclosure.
Figure 2F:
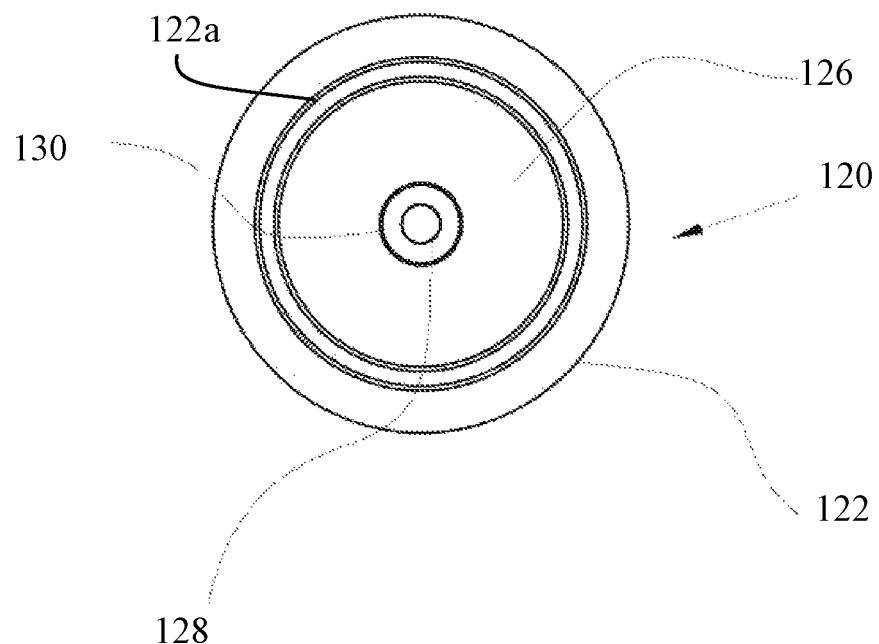
FIG. 2F is a front illustrative view of one example of a female magnetic connector according to various embodiments of the present disclosure.
Figure 3A:
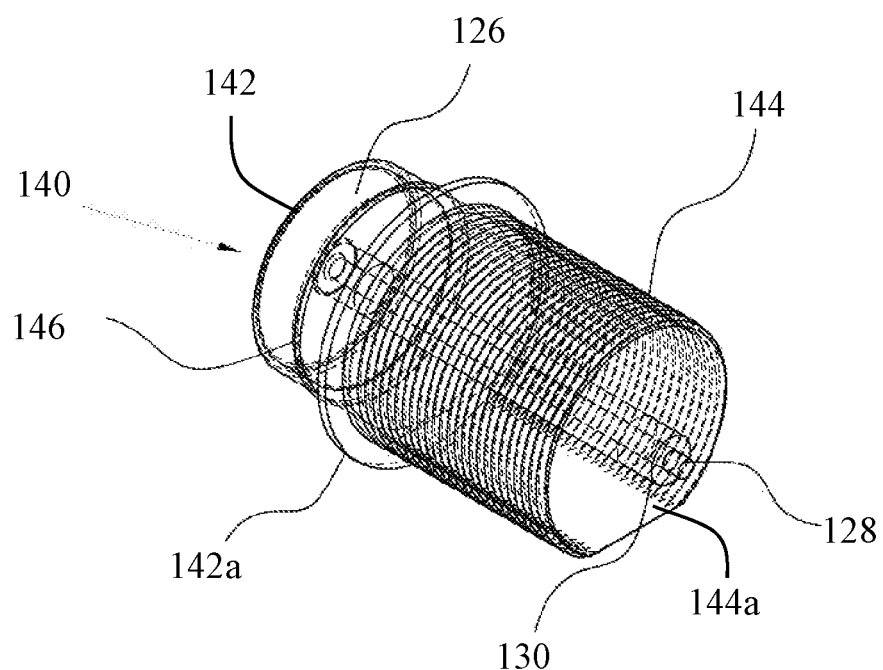
FIG. 3A is a front isometric hollow illustrative view of one example of a male magnetic connector according to various embodiments of the present disclosure.
Figure 3B:
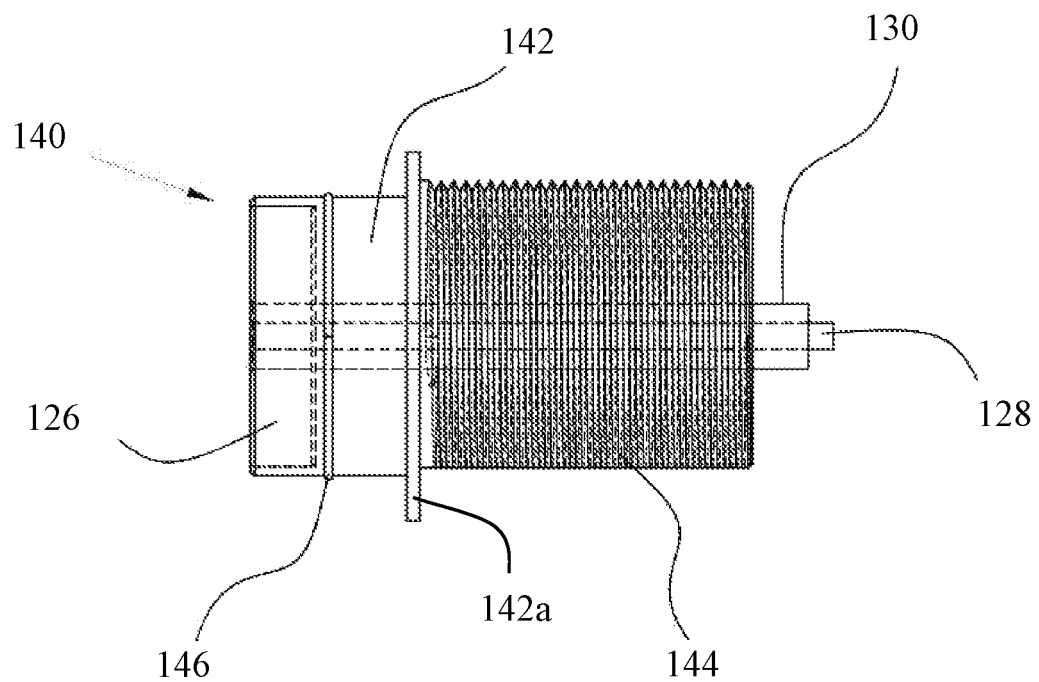
FIG. 3B is a side hollow illustrative view of one example of a male magnetic connector according to various embodiments of the present disclosure.
Figure 3C:
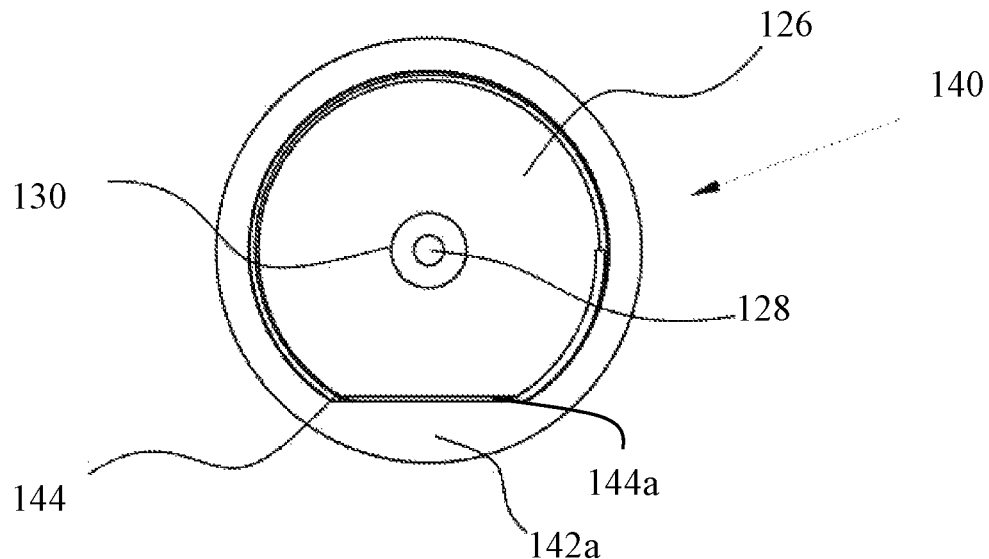
FIG. 3C is a rear illustrative view of one example of a male magnetic connector according to various embodiments of the present disclosure.
Figure 3D:
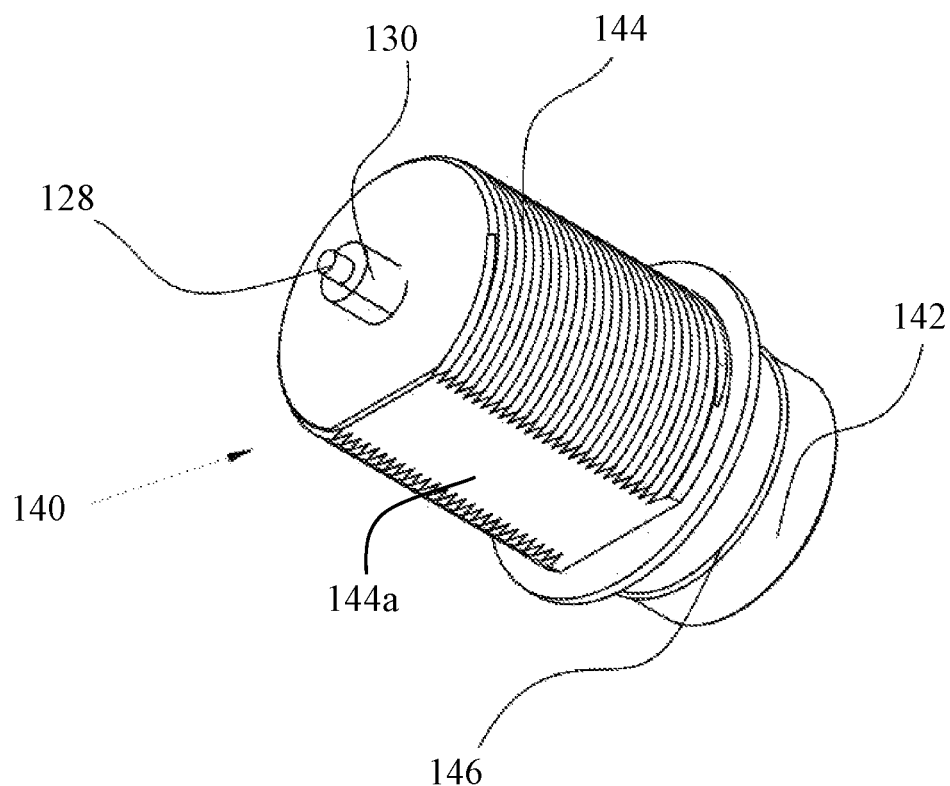
FIG. 3D is a rear perspective illustrative view of one example of a male magnetic connector according to various embodiments of the present disclosure.
Figure 3E:
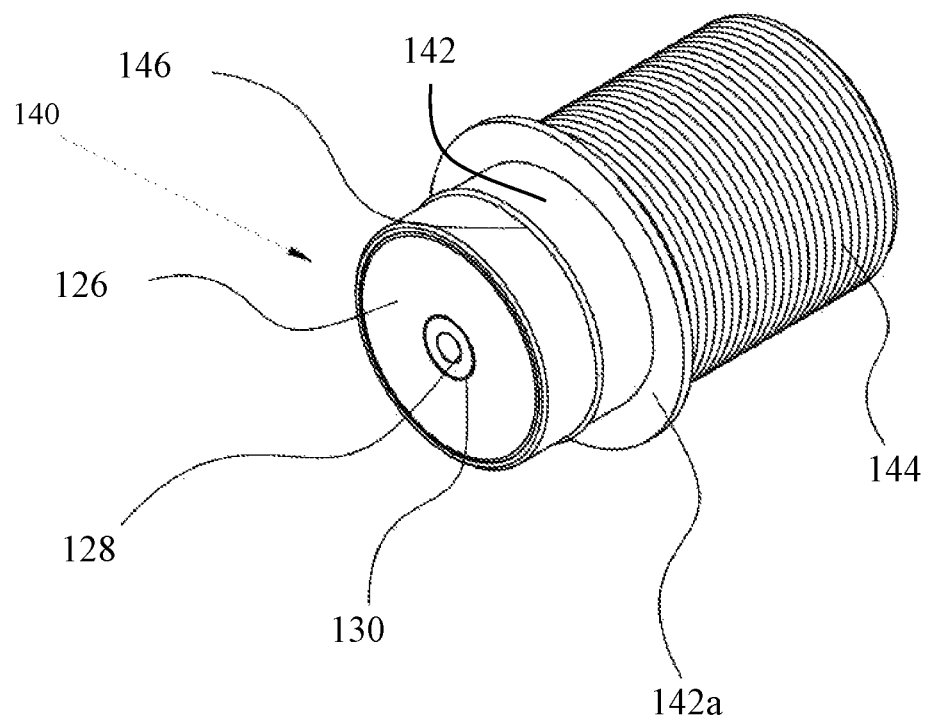
FIG. 3E is a front perspective illustrative view of one example of a male magnetic connector according to various embodiments of the present disclosure.
Figure 3F:
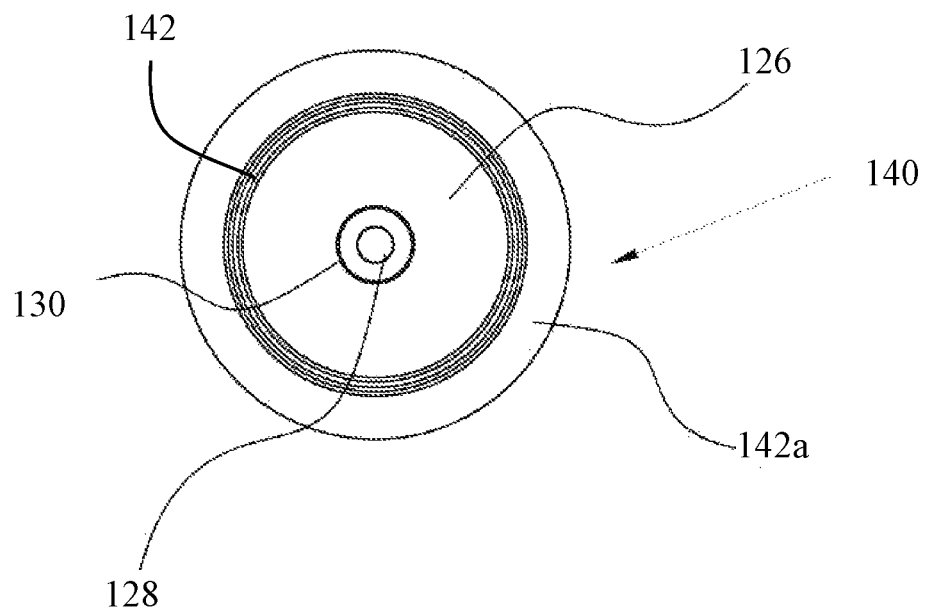
FIG. 3F is a front illustrative view of one example of a male magnetic connector according to various embodiments of the present disclosure.
Figure 11A:
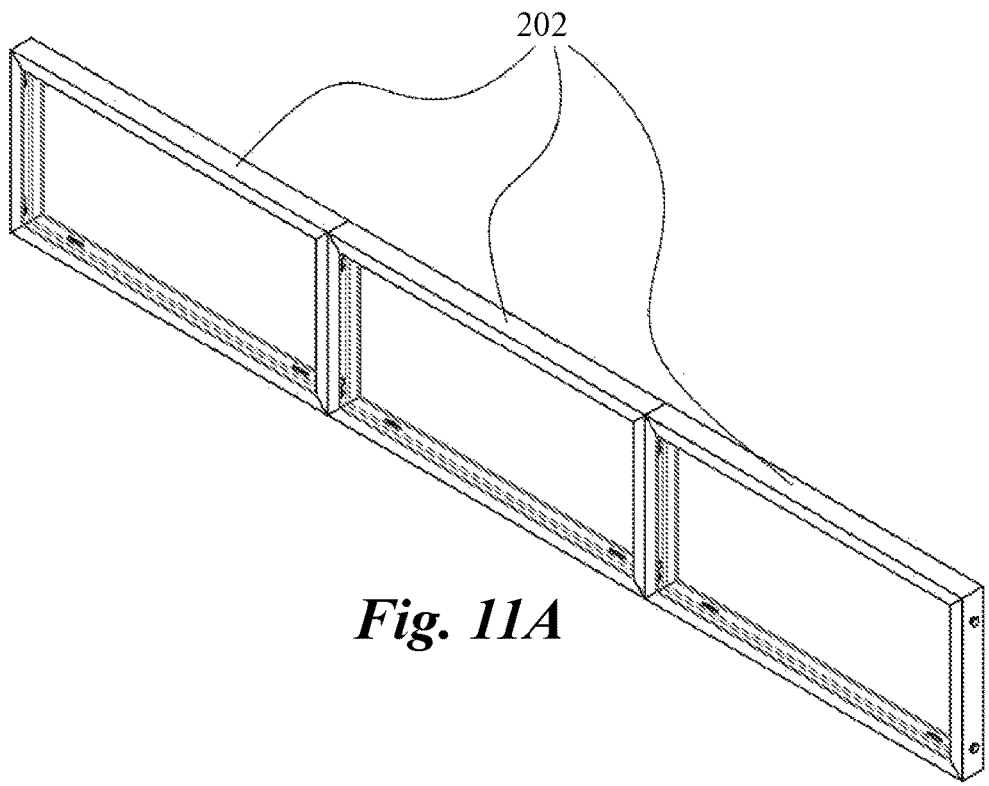
FIG. 11A is a front isometric illustrative view of one example of a series of connected sub-frames according to various embodiments of the present disclosure.
Figure 11B:
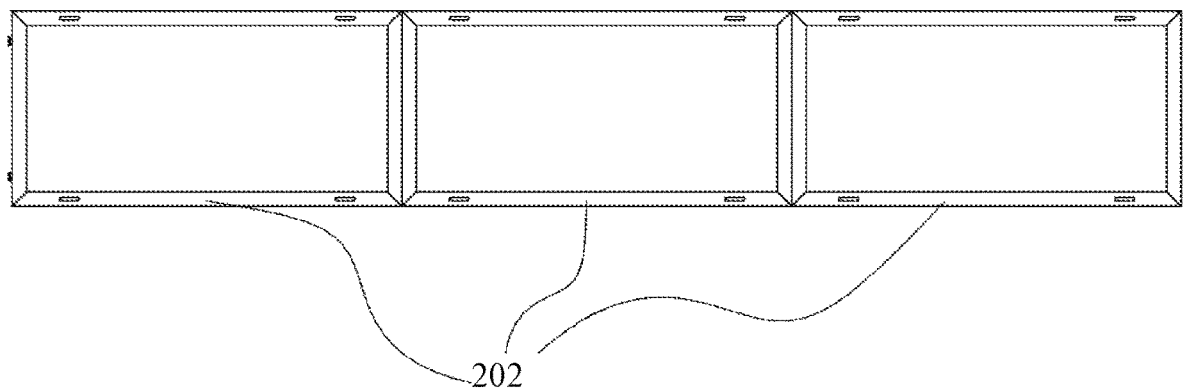
FIG. 11B is a rear illustrative view of one example of a series of connected sub-frames according to various embodiments of the present disclosure.

Referring FIG. 1F an example front view of the PV module 100 with a solar panel 104 and magnetic connectors 120, 140 attached thereto to enable physical and electric coupling with other PV modules 100, as discussed in greater detail with respect to FIGS. 11A-11B, is provided.

Referring to FIGS. 2A-2F, in some embodiments, the magnetic connectors 120 can be female connectors. In some embodiments, the female magnetic connector 120 includes a housing with a head 122 having a shank 124 extending therefrom. The head 122 and the shank 124 can include any combination of shapes that can serve as an enclosure for parts within the magnetic connector 120 while being at least partially insertable into the plurality of connection openings 108 of the frame 102. In some embodiments, the combination of the head 122 and the shank 124 can form an enclosure similar in shape to a bolt or a screw. The shank 124 can be unthreaded, partially threaded, or entirely threaded. For example, as depicted in FIGS. 2A-2F, a majority of the shank 124 is threaded to provide an attachment means. In some embodiments, the shank 124 can be threaded and sufficiently long to provide secure attachment with one of the plurality of connection openings 108 in the frame 102.

Figure 4A:
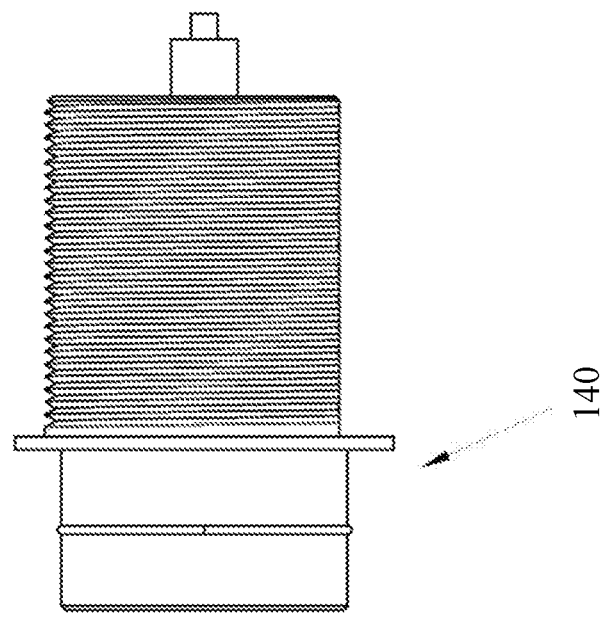
FIG. 4A is a side illustrative view of one example of a male magnetic connector and female magnetic connector according to various embodiments of the present disclosure.
Figure 4A:
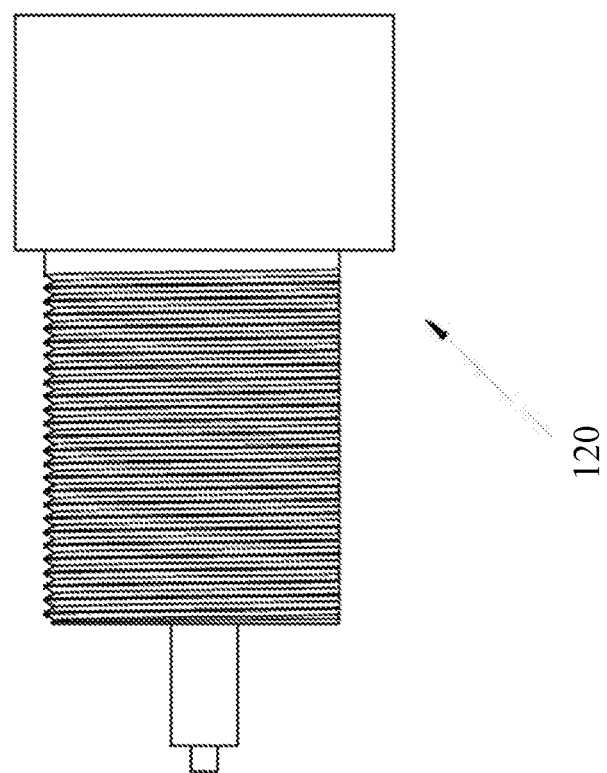
Figure 4B:
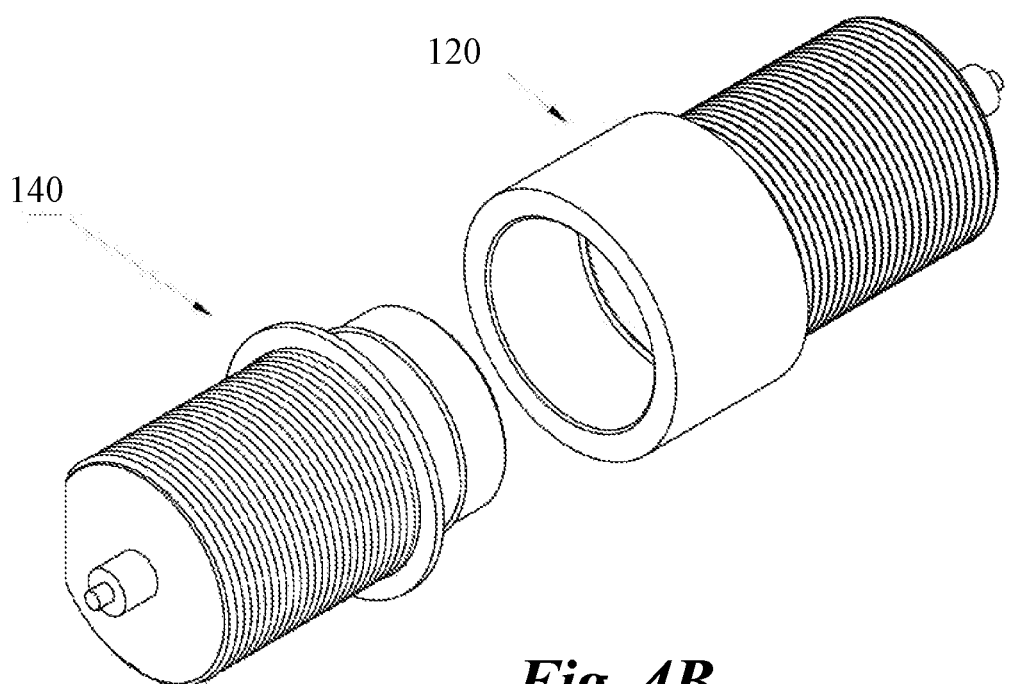
FIG. 4B is a female front perspective illustrative view of one example of a male magnetic connector and female magnetic connector according to various embodiments of the present disclosure.
Figure 4C:
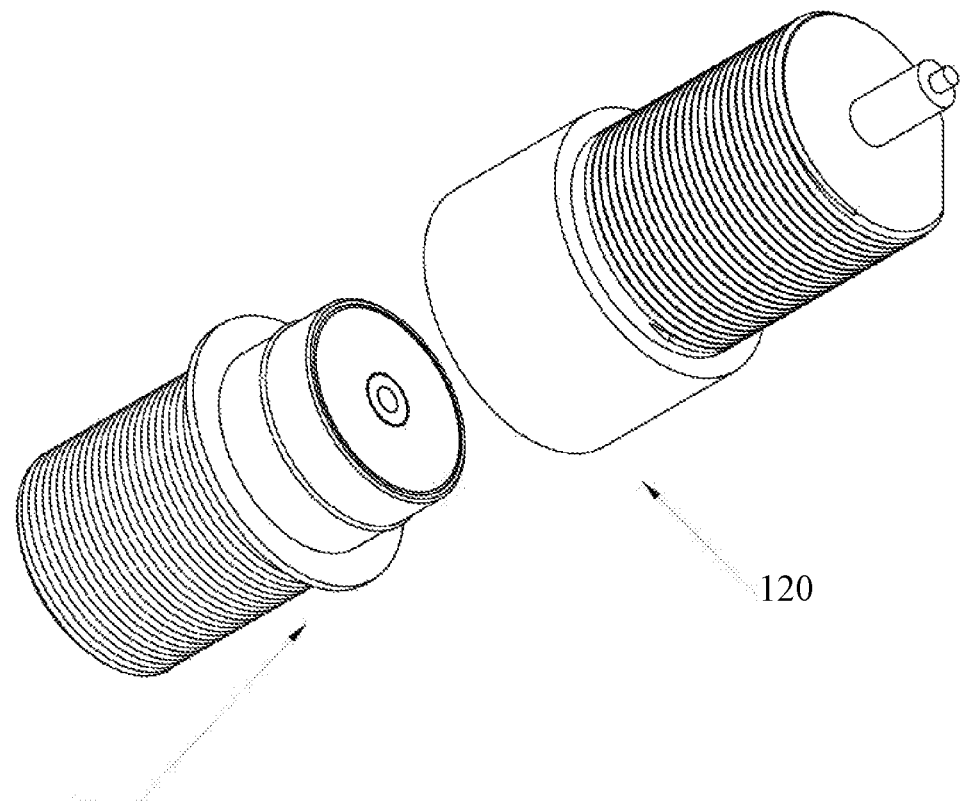
FIG. 4C is a male front perspective illustrative view of one example of a male magnetic connector and female magnetic connector according to various embodiments of the present disclosure.

Any combination of geometric shapes can be used for the head 122 and the shank 124 of the female magnetic connector 120. For example, the head 122 and shank 124 can be round shape, polygonal shape, or any other shape. In some embodiments, the head 122 and the shank 124 of the female magnetic connector 120 do not necessarily need to be the same shape. For example, as depicted in FIGS. 2A-2F, the head 122 can be a substantially round while the shank 124 can be substantially cylindrical with a substantially flat portion 124a to form a D-shape. In some embodiments, the head 122 can include a recess 122a for receiving a head of another magnetic connector. For example, the recess 122a can be sized and shaped to substantially conform to the size and shape of the head 142 portion of a male magnetic connector 140 to establish a coupled pair (forming a single magnetic coupler), as depicted in FIGS. 4A-4C.

In some embodiments, the head 122 can be dimensioned with a diameter greater than that of the shank 124 such that as the shank 124 is able to be inserted through one of the plurality of connection openings 108 while the head 122 is not. In some embodiments, the head 122 can be designed to limit the depth of penetration of the shank 124 within an opening 108. In some embodiments, the shape of the shank 124 can be provided to properly orientate the connector 120 within a specified opening (e.g., connection opening 108). For example, the shank 124 can be a D-shaped shank that corresponds to a D-shaped opening 108 within the frame 108. Any combination of methods and systems can be used to properly orientate the connector 120. For example, the head 122 and/or shank 142 can include a groove, marking, etc. showing which orientation is designed for installation. In some embodiments, the shank 124 can be at least partially threaded such that it can interface with threads within the plurality of connection openings 108 as a means of attachment.

Referring to FIGS. 3A-3F, in some embodiments, the magnetic connectors 140 can be male connectors. In some embodiments, the male connectors connector 140 includes a housing with a head 142 having a shank 144 extending therefrom. The head 142 and the shank 144 can include any combination of shapes that can serve as an enclosure for parts within the magnetic connector 120 while being at least partially insertable into the plurality of connection openings 108 of the frame 102. In some embodiments, the combination of the head 142 and the shank 144 can form an enclosure similar in shape to a bolt or a screw. The shank 144 can be unthreaded, partially threaded, or entirely threaded. For example, as depicted in FIGS. 3A-3F, a majority of the shank 144 is threaded.

Any combination of geometric shapes can be used for the head 142 and the shank 144 of the male magnetic connector 140. For example, the head 142 and shank 144 can be round shape, polygonal shape, or any other shape. In some embodiments, the head 142 and the shank 144 of the male magnetic connector 140 do not necessarily need to be the same shape. For example, as depicted in FIGS. 3A-3F, the head 142 can be a substantially round while the shank 144 can be substantially cylindrical with a substantially flat portion 144a to form a D-shape. In some embodiments, the head 142 can be sized and shaped for fitting within a recess in a head of another magnetic connector. For example, the head 142 can be sized and shaped to substantially conform to the size and shape of the recess 122a in the head 122 portion of a female magnetic connector 120 to establish a coupled pair, as depicted in FIGS. 4A-4C.

In some embodiments, the head 144 can include a rubber O-ring 146 or other rubber material to assist in a secure coupling when the head 142 is inserted into the recess 122a of another head 122. The O-ring 146 be positioned circumferentially on a surface or within a groove provided within the head 142 at a position to provide sufficient frictional force when inserted within a recess for a secure and airtight/watertight fit. For example, as depicted in FIGS. 3A-3C and 3E, the O-ring 146 can be position at approximately the halfway point of the head 142. Any combination of methods or mechanisms can be used in addition to or in place of the O-ring 146 to tightly securing connection between the male magnetic connector 140 and the female magnetic connector 120 weatherization. For example, the head 122 of the female magnetic connector 120 can include an O-ring, or indentations for receiving a protrusion extending from the head 142 of the male magnetic connector 140.

In some embodiments, the head 142 can include a lip 142a dimensioned with a diameter greater than that of the shank 144 such that as the shank 144 is able to be inserted through one of the plurality of connection openings 108 while the lip 142a of the head 142 is not. The lip 142a can be designed to limit the depth of penetration of the shank 144 within an opening 108. In some embodiments, the shape of the shank 144 can be provided to properly orientate the connector 140 within a specified opening (e.g., connection opening 108). For example, the shank 144 can be a D-shaped shank that corresponds to a D-shaped opening 108 within the frame 108. Any combination of methods and systems can be used to properly orientate the connector 140. For example, the head 142 and/or shank 142 can include a groove, marking, etc. showing which orientation is designed for installation. In some embodiments, the shank 144 can be at least partially threaded such that it can interface with threads within the plurality of connection openings 108 as a means of attachment.

Although the present disclosure discusses the use of the connectors 120, 140 being inserted through the plurality of connection openings 108, a combination of other components can be combined with the connectors 120, 140 to form a good fit against the frame 102. For example, the connectors 120, 140 can be accompanied by any combination of washers, nuts, gaskets, O-rings, etc. known in the art. Although the connectors 120, 140 are depicted with substantially flat surfaces on a top of the heads 122, 142 and bottom of the shanks 124, 144, any combination of shapes can be used without departing from a scope of the present disclosure. For example, the tops and bottoms can be beveled, pointed, rounded, etc. as long as they are still able to couple with their respective coupling points (e.g., top of head 142 with bottom of recess 122a in head 122).

Continuing with FIGS. 2A-2F and 3A-3F, the housing of the magnetic connectors 120, 140 can be made from any combination of materials, of any combination of dimensions, and shapes (e.g., different screw or bolt type designs). For example, as shown in FIGS. 2A-3F, the magnetic connectors 120, 140 can be D-shaped threaded bolts made from some combination of plastic, metal, or other material. In some embodiments, at least a portion of the head 142 of the male magnetic connector 140 should be a material (e.g., metal) able to be influenced by magnetic forces, as discussed in greater detail herein.

In some embodiments, the heads 122, 142 and the shanks 124, 144 of the magnetic connectors 120, 140 can serve as enclosures for a combination magnetic material 126, a conductive material 128, and an insulating material 130. The magnetic material 126 can include any combination of magnetic materials with sufficient force to attract a portion of a corresponding head of a connector 120, 140. In some embodiments, the magnetic material 126 can be positioned within a base of the recess 122a of the head 122 and/or embedded within the head 142. The magnetic material 126 can be of sufficient size and magnetic force to assist in holding the head 142 of the male magnetic connector 140 within the recess 122a of the female magnetic connector 120. In some embodiments, the male magnetic connector 140 can have magnetic material 126 with an opposing magnetic force as the magnetic material 126 of the female magnetic connector 120 to increase the magnetic attraction with other magnets in other connectors.

The magnetic material 126 can be embedded within and/or coupled to either of the heads 122, 142 using any combination of methods. For example, the magnetic material 126 can be a magnetic disk adhered within the recess 122a of head 122 and/or adhered to a top portion of head 142.

In some embodiments, the conductive material 128 can extend through the heads 122, 142 and the shanks 124, 144 of the respective magnetic connectors 120, 140 to create a continuous conductive path through the magnetic connectors 120, 140. In some embodiments, the conductive material 128 can also extend through other elements of the connectors 120, 140, for example, through the magnetic material 126 and/or the insulating material 130. The conductive material 128 can include any combination of materials, sizes, and shapes capable of transporting an electrical current therethrough. For example, as depicted in FIGS. 2A-2F and 3A-3F, the conductive material 128 can be a wire extending through a center of the magnetic connector 120. Although a single conductive wire through a central point of the magnetic connectors 120, 140 is depicted, the conductive material 128 can be positioned at any location(s) through the magnetic connectors 120, 140 and/or can include a plurality of conductive materials 128 extending therethrough. For example, the magnetic connectors 120, 140 can include a plurality of wires extending the length of the heads 122, 142 and the shanks 124, 144 housing the conductive material 128. Although a copper wire is provided as an example, the conductive material 128 can be any combination of metals or other conductive materials, such as gold, aluminum, platinum, etc.

In some embodiments, the insulating material 130 can be positioned within the heads 122, 142 and/or the shanks 124, 144 and at least partially encasing the conductive material. The insulating material 130 can be provided to prevent contact between the conductive material 128 and any potentially conductive materials that the heads 122, 142 and/or the shanks 124, 144 are constructed from. In other words, the insulating material 130 can be a non-conductive shielding surrounding the conductive material 128 to protect the conducive material 128 from transferring energy to a metal of the head 122, 142/shank 124, 144 of the connector 120, 140 housing. For example, the insulating material 130 can be any combination of rubber, paper, glass, plastic, ceramic, etc. or other non-conductive materials. The insulating material 130 can include any combination of materials, sizes, and shapes capable of protecting the conductive material 128 and from electrical energy, current, etc. from transferring from the conductive material 128 to the rest of the connectors 120, 140. The combination of the conductive material 128 and the insulating material 130 can be formed using any combination of methods known in the art.

In some embodiments, at least a portion of the conductive material 128 and/or the insulating material 130 can extend from and beyond the ends of at least one of the heads 122, 142 and the shanks 124, 144. For example, as shown in FIGS. 2A, 2B, 2D, 2E, 3A, 3B, and 3D, both the conductive material 128 and the insulating material 130 extend beyond the ends of the shanks 124, 144. Similarly, in some embodiments, the conductive material 128 can extend beyond the end of the insulating material 130, as shown in FIGS. 2A, 2B, 2D, 2E, 3A, 3B, and 3D. In some embodiments, at least a portion of the conductive material 128 and/or the insulating material 130 can be substantially flush with a base surface of the heads 122, 142, as shown in FIGS. 2A, 2B, 2C, 2E, 3A, 3B, 3C, and 3E. Similarly, in some embodiments, conductive material 128 and/or the insulating material 130 can be recessed within the ends of at least one of the heads 122, 142 and the shanks 124, 144.

In some embodiments, the amount of protrusion and recession of the conductive material 128 and the insulating material 130 can correspond to the recession and protrusion of their respective coupling members. For example, when the conductive material 128 and the insulating material 130 a substantially flush within a surface of the heads 122, 142, the conductive materials from the magnetic connectors 120, 140 will contact one another to form an electrically connection when the head 142 is inserted within the head 122.

Referring to FIGS. 4A-4C, in some embodiments, the male and female magnetic connectors 120, 140 are designed to attached and couple to one another to form a connected pairing capable of providing a continuous electrical pathway over the respective conductive materials 128 therein. FIG. 4A depicts an example side view of how the magnetic connectors 120, 140 couple together, FIG. 4B depicts an example female front perspective view of how the magnetic connectors 120, 140 couple together, and FIG. 4C depicts an example male front perspective view of how the magnetic connectors 120, 140 couple together. In some embodiments, to couple the magnetic connectors 120, 140 together, the head 142 of the male magnetic connector 140 can be inserted into the recess 122a of the head 122 of the female magnetic connector 120. The head 142 and recess 122a can be substantially the same size and shape such that the head 142 substantially fills the recess 122a upon insertion. In some embodiments, a combination of the magnetic materials 126 and the rubber O-ring 146 can assist maintaining the coupling of the two magnetic connectors 120, 140 such that the respective conductive materials 128 are substantially flush to maintain a consistent electrical pathway.

In some embodiments, the conductive material 128 and/or the insulating material 130 of the respective magnetic connectors 120, 140 can be positioned such that they contact one another upon full insertion of the head 142 within the recess 122a. The connection of the conductive material 128 from both magnetic connectors 120, 140 can create an electrical connection from the end (e.g., the end of the shank 124) of the female magnetic connector 120 to the end (e.g., the end of the shank 144) of the male magnetic connector 140. The conductive materials 128 are in a sufficient amount of contact to transmit an electrical signal, power, etc. without interruption, arcing, etc. In other words, the conductive materials 128 contact one another in a manner to effectively form a continuous wire between the magnetic connectors 120, 140, such that electricity applied to the end of the male connector 140 can be transmitted to the opposing end of the female connector 120 and vice versa. In some embodiments, the magnetic connectors 120, 140 can also be used to transfer power to other devices, for example a battery, battery casing 160, or other system by having the conductive material 128 contact an input/output for the target device.

Although the present disclosure is described with respect to creating an electrical connection using the conductive material 128, the conductive material 128 could be replaced with another medium to yield a similar communicative effect. For example, the conductive material 128 could be replaced with fiber optics, glass, etc. to establish other power or communication pathways. Alternatively, the magnetic connectors 120, 140 could include separate pathways for the conductive material 128 and another medium (e.g., fiber).

Figure 5A:
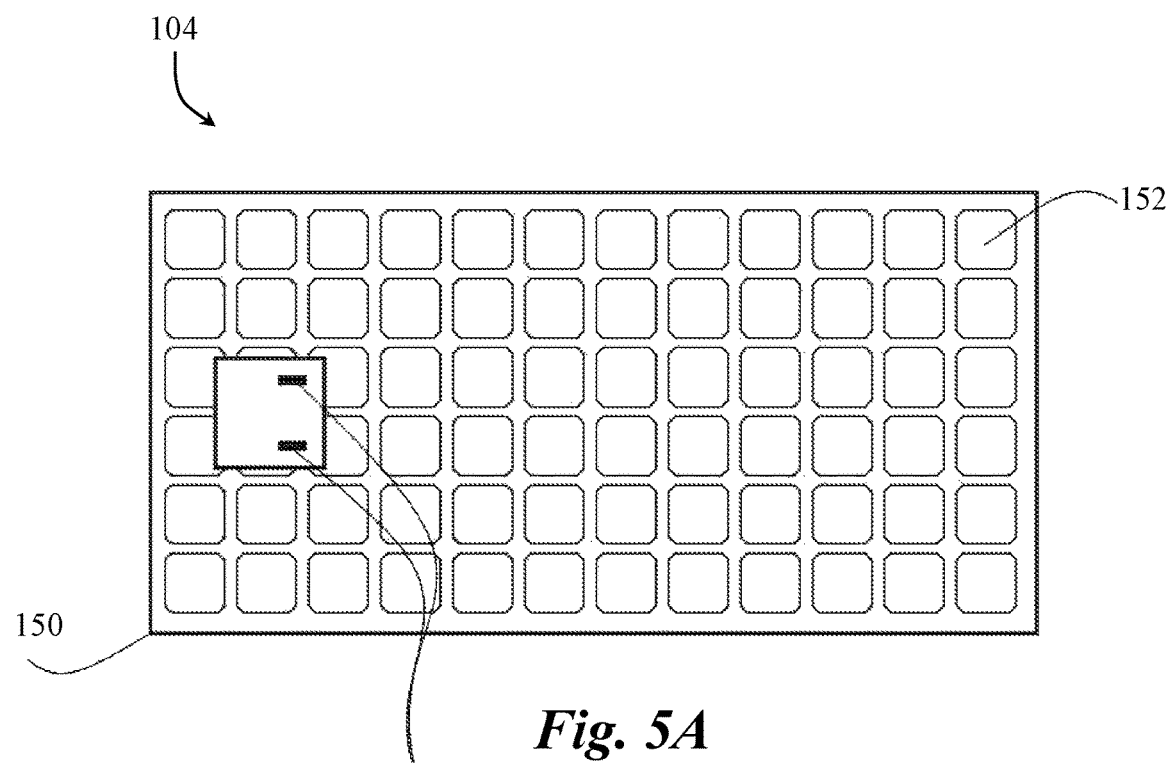
FIG. 5A is a rear illustrative view of one example of a photovoltaic cell casing according to various embodiments of the present disclosure.
Figure 5B:
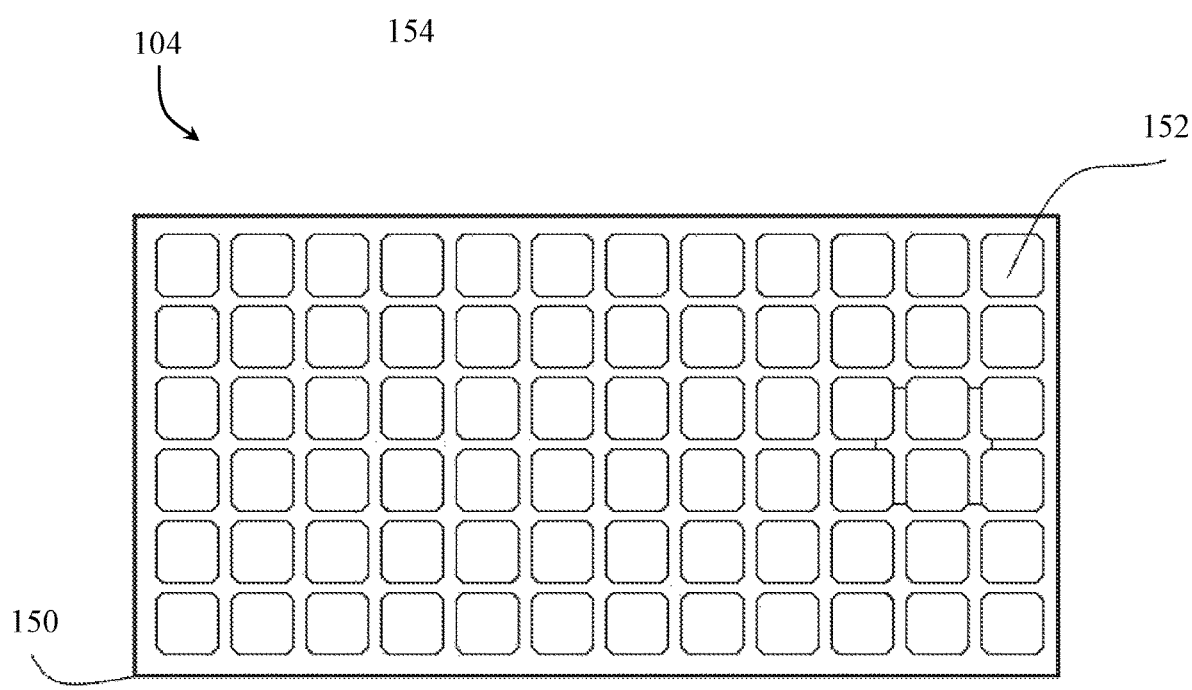
FIG. 5B is a front illustrative view of one example of a photovoltaic cell casing according to various embodiments of the present disclosure.
Figure 5C:
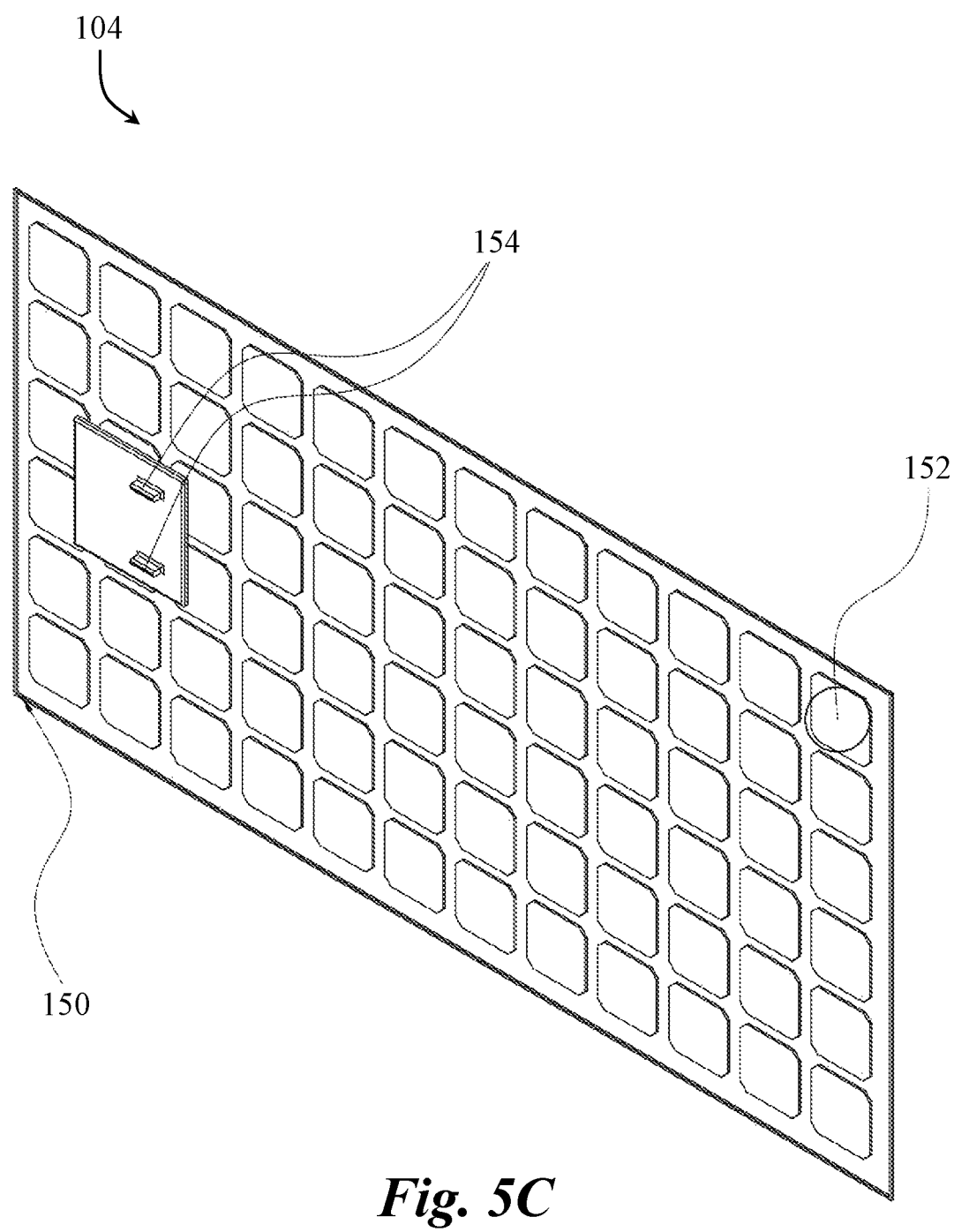
FIG. 5C is a rear isometric illustrative view of one example of a photovoltaic cell casing according to various embodiments of the present disclosure.

Referring to FIGS. 5A-5C, in some embodiments, the PV module 100 can include a solar panel 104 including a photovoltaic cell casing 150 housing a plurality of photovoltaic cells 152 each electrically connected to a photovoltaic output junction 154. FIG. 5A depicts a rear view of the photovoltaic cell casing 150, FIG. 5B depicts a front view of the photovoltaic cell casing 150, and FIG. 5C depicts an isometric front view of the photovoltaic cell casing 150. The photovoltaic cell casing 150 can include any combination of materials constructed in a manner that is suitable for acting as an enclosure for the plurality of photovoltaic cells 152. For example, the photovoltaic cell casing 150 can include multiple encapsulant layers with the plurality of photovoltaic cells 152 sandwiched therebetween, a protective covering (e.g., a glass layer), and a back sheet to protect the rear side of the photovoltaic cells 152.

Referring to FIGS. 5A and 5C, in some embodiments, the photovoltaic cell casing 150 can include an output junction 154 wired to the plurality of photovoltaic cells 152 for converting power received from the plurality of photovoltaic cells 152 into an output for use by a PV system or other systems. For example, the output junction 154 can include a two-prong out for output power received from the plurality of photovoltaic cells 152. In some embodiments, the photovoltaic cell casing 150 can include a combination of other electrical components designed for use in solar panels. For example, the photovoltaic cell casing 150 can include integrated energy cooling, DC-to-AC inverter or other energy conversion system, surge protection from lightening, EMP, or other external sources, etc. In some embodiments, the output junction 154 can be designed to distribute the power from the plurality of photovoltaic cells 152 into a storage device, for example, a battery 110.

Figure 6A:
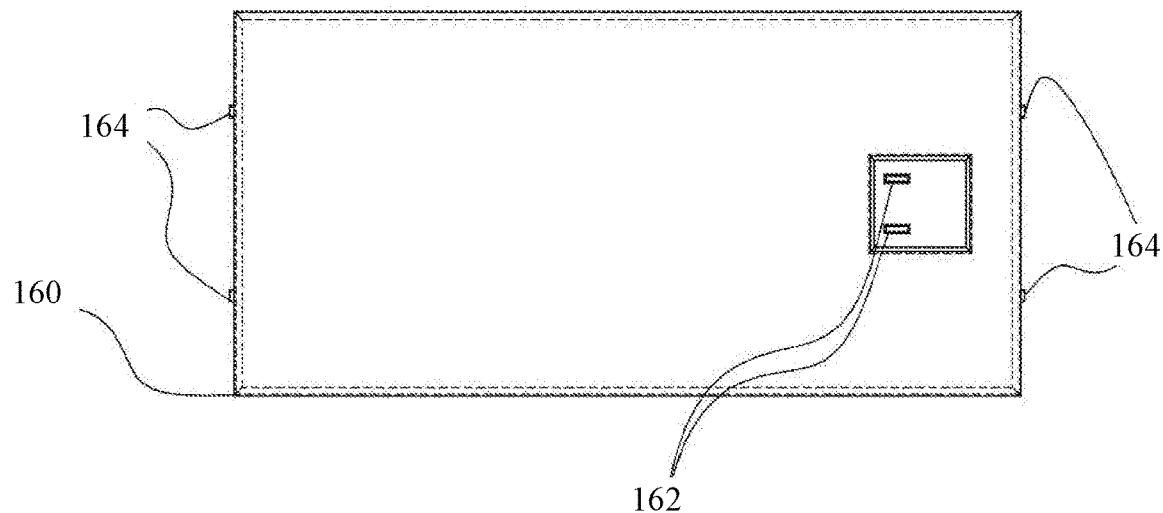
FIG. 6A is a rear illustrative view of one example of a battery casing according to various embodiments of the present disclosure.
Figure 6B:
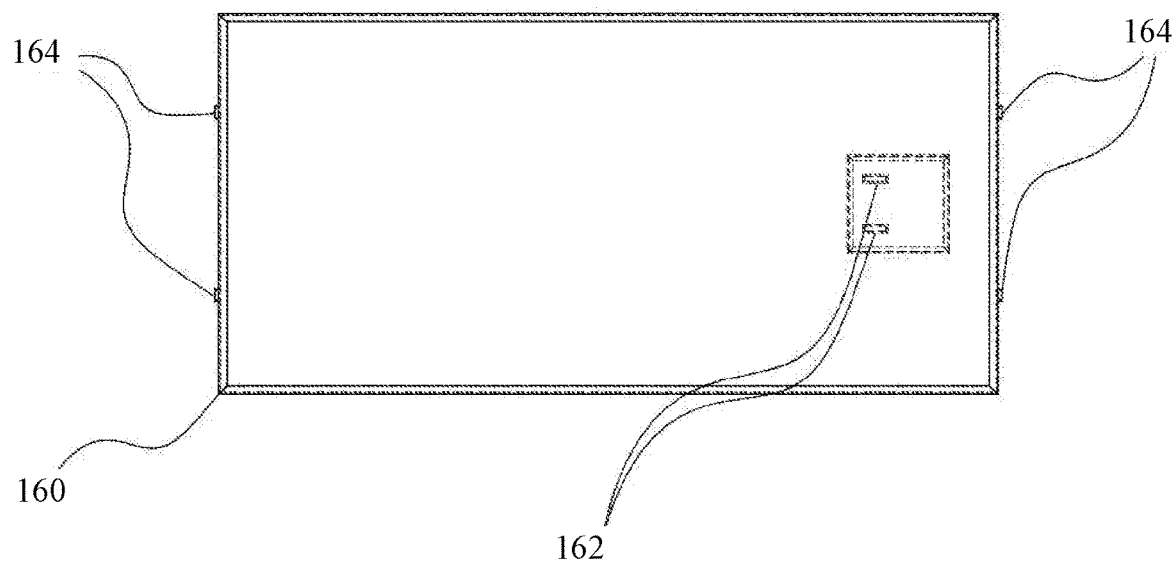
FIG. 6B is a front illustrative view of one example of a battery casing according to various embodiments of the present disclosure.
Figure 6C:
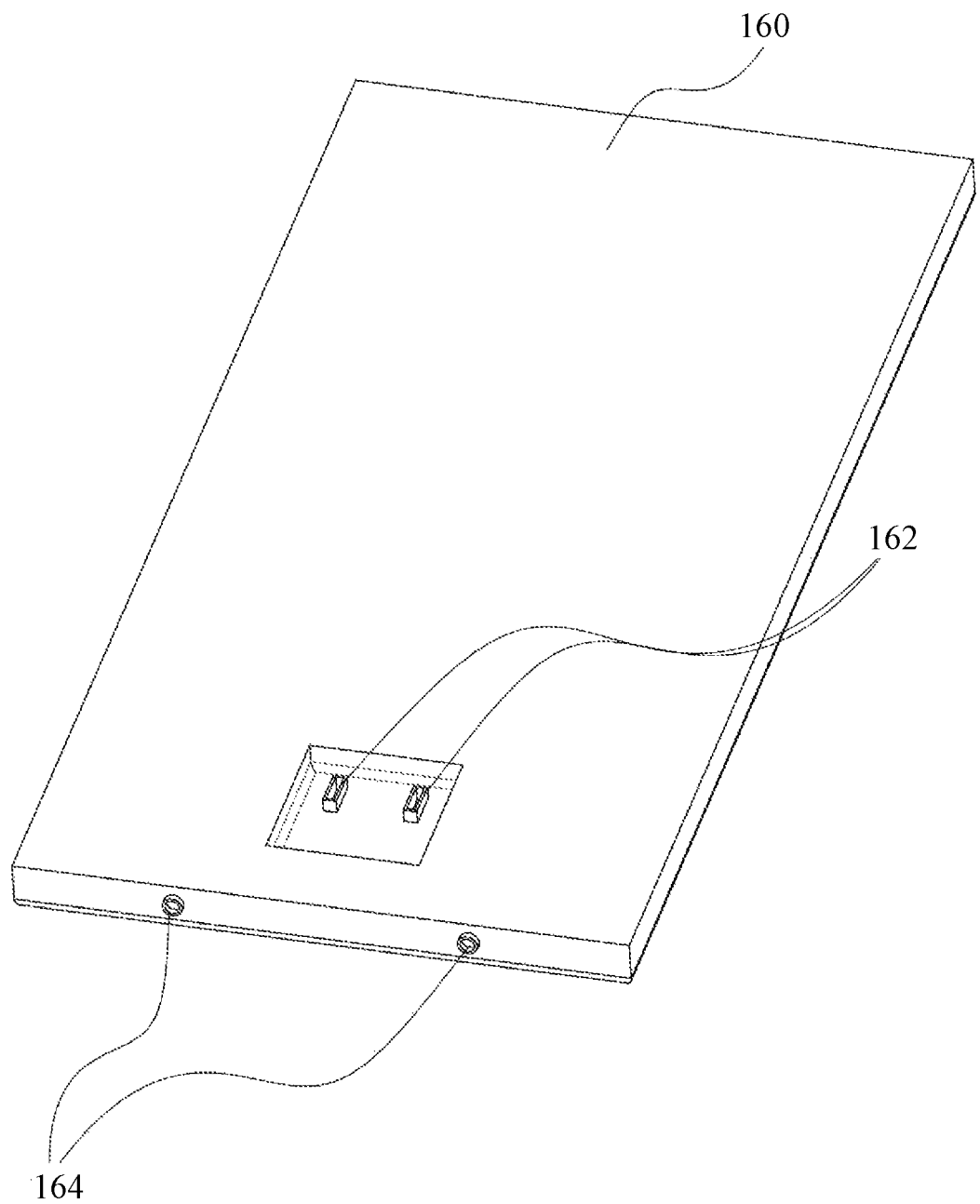
FIG. 6C is a rear isometric illustrative view of one example of a battery casing according to various embodiments of the present disclosure.

Referring to FIGS. 6A-6C, in some embodiments, the PV module 100 can include a battery casing 160 for housing electrical components for storing electrical energy in one or more batteries 110. The battery casing 160 can include any combination of removably and replaceable batteries for storing energy received from the photovoltaic cell casing 150 or from other PV modules 100. For example, the batteries 110 can be designed with nickel-manganese-cobalt chemistry, solid state technology, etc. with the majority of the batteries materials made of components that are non-flammable solid polymer plastics. The battery casing 160 can include any combination of components for creating an electrical pathway from one end of the PV module 100 to another end. FIG. 6A depicts a front view of the battery casing 160, FIG. 6B depicts a rear view of the battery casing 160, and FIG. 6C depicts an isometric front view of the battery casing 160. The battery casing 160 can include any combination of materials constructed in a manner that is suitable for acting as an enclosure for the electronics and batteries 110. For example, the battery casing 160 can be an aluminum case with insulation and sealing to create an airtight/watertight enclosure. Similarly, the batter(ies) 110 can be sized and dimensioned to fit within the battery casing 160.

In some embodiments, the battery casing 160 can include a battery input 162 designed to receive electricity one or more contacts. The battery input 162 can include any combination of materials and configurations designed to receive and relay power to one or more batteries 110 for storage. In some embodiments, the battery input 162 can also be designed to be electrically coupled to the output junction 154 of the photovoltaic cell casing 150. For example, the battery input 162 can include two prong contacts which can serve as connection points for the output junction 154 relaying power from the photovoltaic cells 152. In some embodiments, the battery casing 160 can include a combination of other electrical components designed for use in solar panels. For example, the battery casing 160 can include integrated energy cooling, DC-to-AC inverter or other energy conversion system, surge protection from lightening, EMP, or other external sources, etc.

In some embodiments, the battery casing 160 can include one or more battery outputs 164 where power stored in battery 110, received from the photovoltaic cell casing 150, or transferred over one or more of the connectors 120, 140 can be transferred from the batteries 110 of the battery casing 160 to a location outside the PV module 100. In some embodiments, the one or more battery outputs 164 can be positioned to align with openings 108 within the frame 102 for coupling with the magnetic connectors 120, 140. In other words, the one or more battery outputs 164 can be designed to specifically receive and electrically couple with the magnetic connectors 120, 140 such that energy can be transferred over the magnetic connectors 120, 140. For example, the one or more battery outputs 164 can include conductive connection to line up and connect with the conductive material 128 of the respective magnetic connectors 120, 140 for transfer of energy over the magnetic connectors 120, 140. In some embodiments, the one or more battery outputs 164 can include a recess for receiving conductive material 128 and/or insulating material 130 protruding from the ends of the shanks 124, 144 of the connectors 120, 140 and for connection to a conductive material within the recess of the one or more battery outputs 164.

In some embodiments, the battery casing 160 can provide an electrical pathway from one or more connectors 120, 140 positioned on one end of the frame 102 to the other. Although the examples provided herein recite the use of a battery casing 150, the connectors 120, 140 could also be directly connected to any combination of the battery casing 150, the frame 102, the photovoltaic cell casing 150 (or the cells 152 themselves) to provide an input and output points for the PV module 100. Although it is discussed in an example embodiment that the battery casing 160, in connection with the magnetic connectors 120, 140 creates a conductive pathway, the frame 102 itself can provide a conductive pathway in conjunction with the magnetic connectors 120, 140. For example, a pathway along the magnetic connectors 120, 140 and the frame 102 through which converted energy can be directed across the PV module 100.

Figure 7:
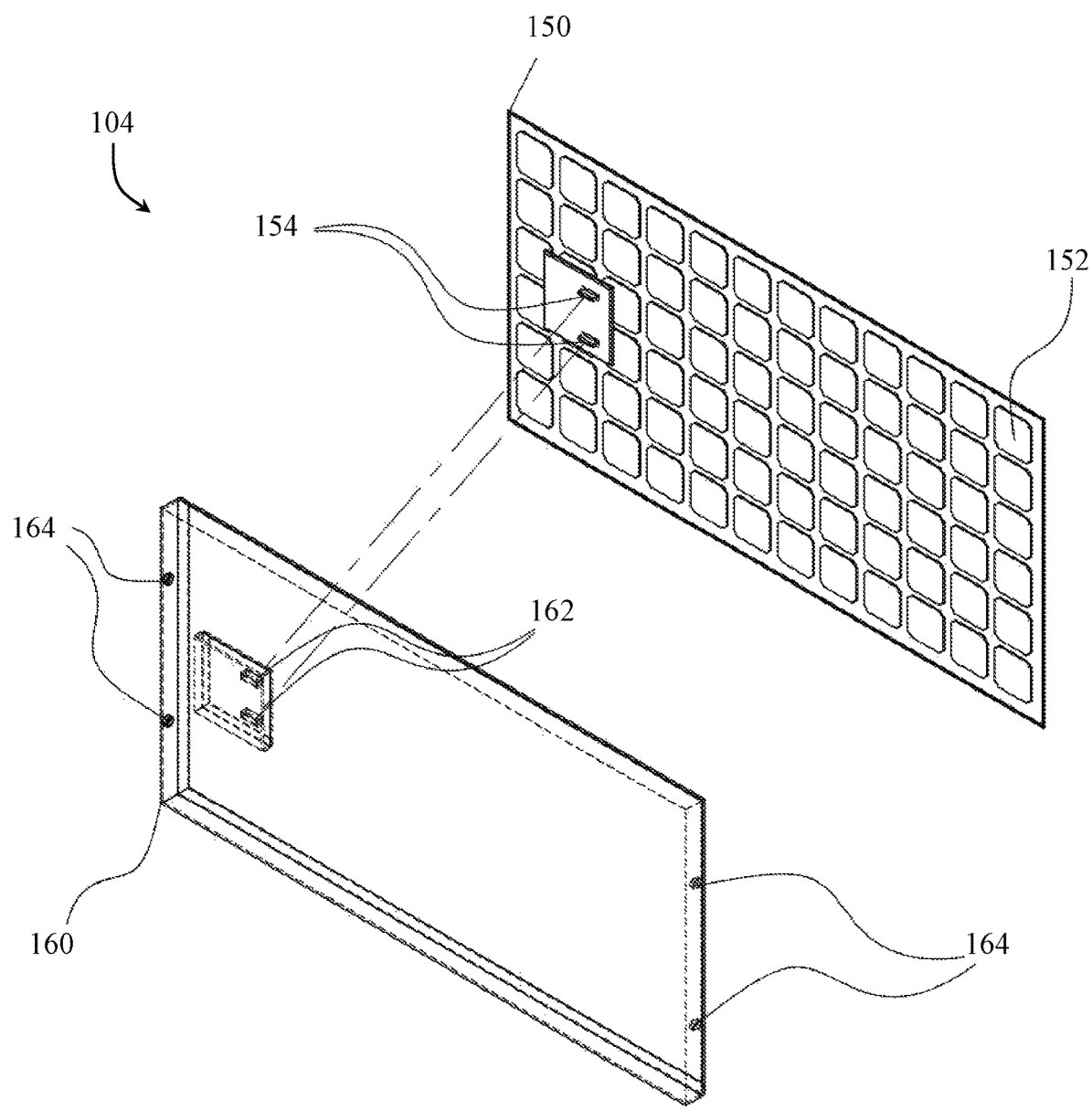
FIG. 7 is an exploded isometric illustrative view of one example of a photovoltaic cell casing and a battery casing according to various embodiments of the present disclosure.

Referring to FIG. 7, in some embodiments, the battery casing 160 can be coupled and electrically connected to the photovoltaic cell casing 150. When coupled, the battery casing 160 can be designed to receive (e.g., via input 162) hold chargeable energy (e.g., in battery 110) received from the photovoltaic cell casing 150 (e.g., via output junction 154) and/or transfer energy for use or storage at an external destination (e.g., via the outputs 164). The battery casing 160 and the photovoltaic cell casing 150 can be coupled together using any combination of manufacturing techniques. For example, they battery casing 160 and the photovoltaic cell casing 150 can be can be mechanically coupled using any combination of screws, adhesive, welding, etc. In some embodiments, the battery casing 160 and the photovoltaic cell casing 150 can be can be coupled together during assembly of the PV module 100.

Referring to FIGS. 8A and 8B, in some embodiments, the photovoltaic cell casing 150 and the battery casing 160 can be assembled with the frame 102 and the magnetic connectors 120, 140 to form the PV module 100. FIG. 8A depicts an exploded unassembled front view of the PV module 100 and FIG. 8B depicts an exploded unassembled rear view of the PV module 100. To form the PV module 100, the photovoltaic cell casing 150 can be coupled to a front face of the frame 202 and the battery casing 160 can be inserted within the frame 202 to be adjacent with the photovoltaic cell casing 150. Each of the photovoltaic cell casing 150 and the battery casing 160 can be coupled to the frame 102 using any combination of methods, for example, using an adhesive, mechanical fastener, and/or welding. In some embodiments, when the photovoltaic cell casing 150 and the battery casing 160 are placed adjacent to one another, the output junction 154 of the photovoltaic cell casing 150 can line up and couple with the battery inputs 162 of the battery casing 160 to form an electrical connection between the two systems.

In some embodiments, a female magnetic connector 120 or a male magnetic connector 140 can be inserted into each of the connection openings 108 within the frame 102. The connectors 120, 140 can be inserted into the connection openings 108 after the battery casing 160 has been inserted into and positioned within the frame 102. The shanks 124, 144 of the connectors 120, 140 can be inserted and/or threaded into the connection openings 108 until the bottom end of the heads 122, 142 contact the frame 102 structure. In some embodiments, the magnetic connectors 120, 140 can be designed to be inserted through the connection openings 108 and into the battery outputs 162 of the battery casing 160 when secured to the frame 202. For example, the magnetic connectors 120, 140 can be lined up with threaded surface of the connection openings 108 and screwed into position until the heads 122, 142 are substantially flush with the frame 102. This process can substantially simultaneously create an electrical connection between the conductive materials 128 of the magnetic connectors 120, 140 and the battery outputs 162. Insertion into the battery outputs 162 can create an electrical connection between the connectors 120, 140 and the internal wiring of the battery casing 160. Although the examples provided herein recite the use of a battery casing 150, the connectors 120, 140 could also be directly connected to any combination of the battery casing 150, the frame 102, the photovoltaic cell casing 150 (or the cells 152 themselves) to provide an input and output points for the PV module 100.

In some embodiments, as depicted in FIGS. 8A-9B, female magnetic connectors 120 can be installed in one end of the frame 102 and male magnetic connectors 140 can be installed in on the opposite end of the frame 102. Any configuration of female or male connectors 120, 140 within the connection openings 108 can be used without departing from the scope of the present disclosure. The female and male connectors 120, 140 can provide inputs and/or outputs for energy transfer to and from each of the PV modules 100 without the use of external wiring. The female or male connectors 120, 140 also provide a design that enable PV modules 100 to be quickly coupled and decoupled to other PV modules 100 or other compatible systems (e.g., capable of communicating electrically with the female or male connectors 120, 140) without the need for any rewiring. Instead, the male connectors 140 merely need to be coupled to the female connectors 120 by connecting their respective heads 122, 142.

In some embodiments, the assembly process depicted in FIGS. 8A-9B can include coupling a photovoltaic cell casing to a frame having a plurality of connection openings, inserting a battery casing within the frame and electrically coupling the battery casing to the photovoltaic cell casing, inserting at least one male connector into a first of the plurality of connection openings, inserting at least one female connector into a second of the plurality of connection openings, and creating an electrical pathway between the at least one male connector and the at least one female connector by coupling the at least one male connector and the at least one female connector to the battery casing. This assembly method can include any combination of steps including assembling the PV module 100 to include features from any of the alternative embodiments discussed herein.

Figure 9A:
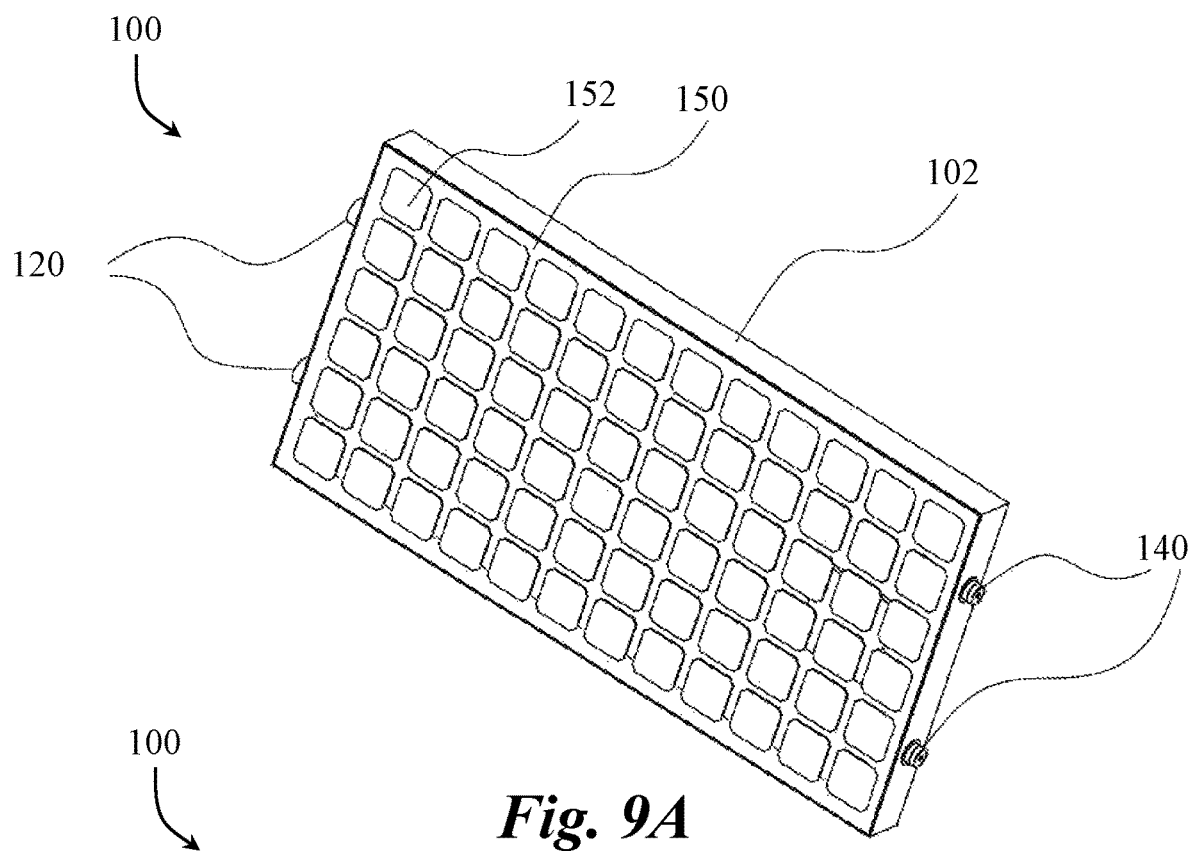
FIG. 9A is a front isometric illustrative view of one example of a PV module according to various embodiments of the present disclosure.
Figure 9B:
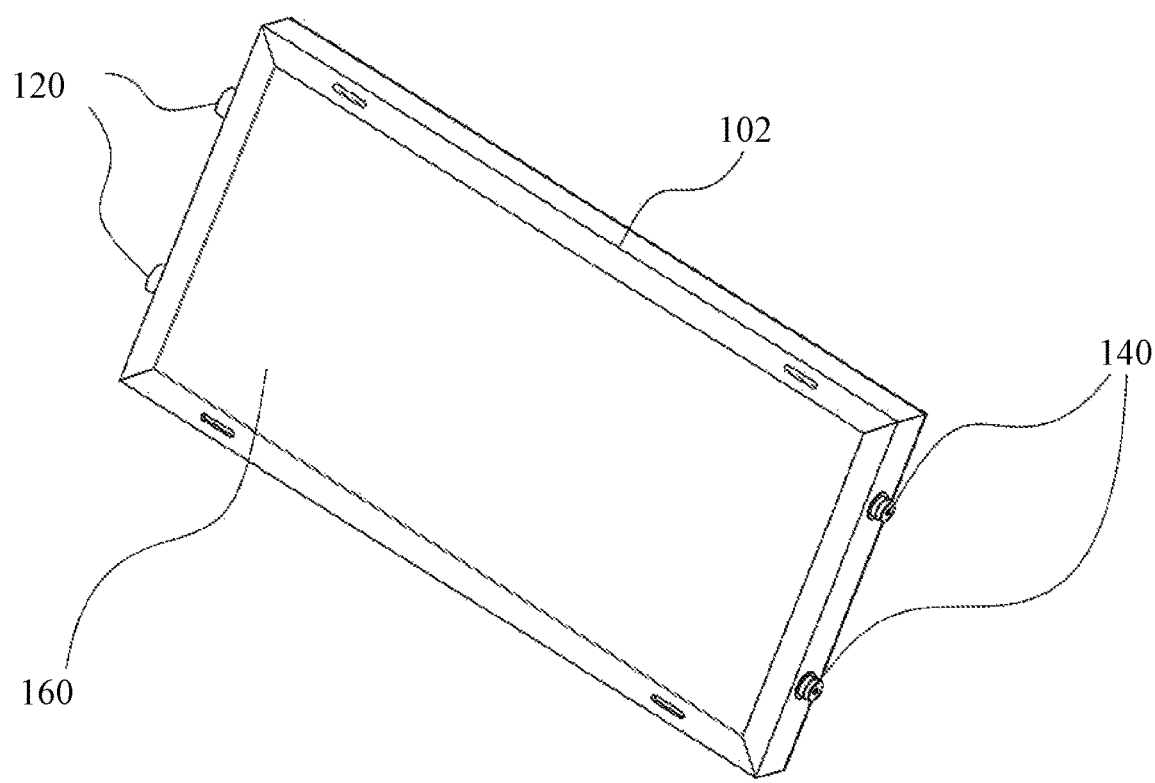
FIG. 9B is a rear isometric illustrative view of a PV module according to various embodiments of the present disclosure.

Referring to FIGS. 9A and 9B, an assembled view of the PV module 100 is depicted. FIG. 9A depicts an assembled front view of the PV module 100 and FIG. 9B depicts an assembled rear view of the PV module 100. The PV module 100 can be assembled, for example, following the steps discussed with respect to FIGS. 8A and 8B. When assembled, in some embodiments, the battery casing 160 can be designed to fit within the frame 102 such that a flush rear surface for the PV module 100 is created by the rear face of the frame 202 and the rear face of the battery casing 160, as depicted in FIG. 9B.

Referring back to FIG. 1E, an illustrative diagram showing the relationship between the magnetic connectors 120, 140, the electrical wiring 112, the batter(ies) 110, and one or more battery outputs 164 is provided. The electrical setup provided in FIG. 1E shows a diagrammatic view for how the components of the present disclosure can create an electrical system extending from one side of a PV module 100 (e.g., connector 140 side) to an opposing side of the PV module 110 (e.g., connector 120 side) to allow the transfer of power from within and/or through each PV module 100. The assembled PV module 100 can integrate all PV system array components from the photovoltaics solar cells 152, battery 110, and magnetic connectors 120, 140 into one unit which eliminates the need for wired connections between PV modules 100.

Figure 10A:
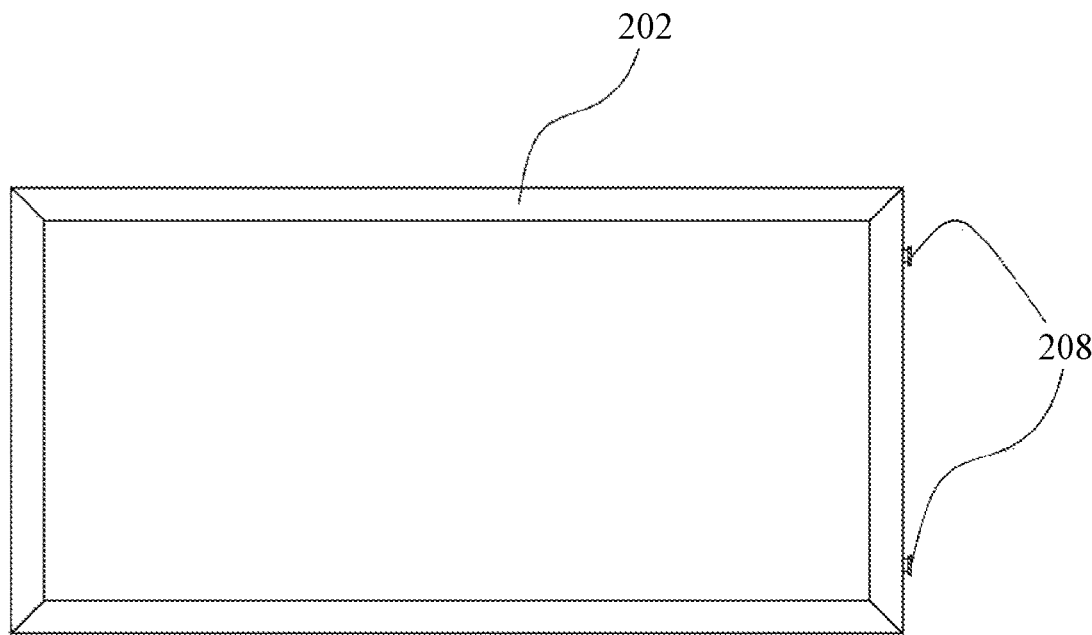
FIG. 10A is a front illustrative view of one example of a sub-frame according to various embodiments of the present disclosure.
Figure 10B:
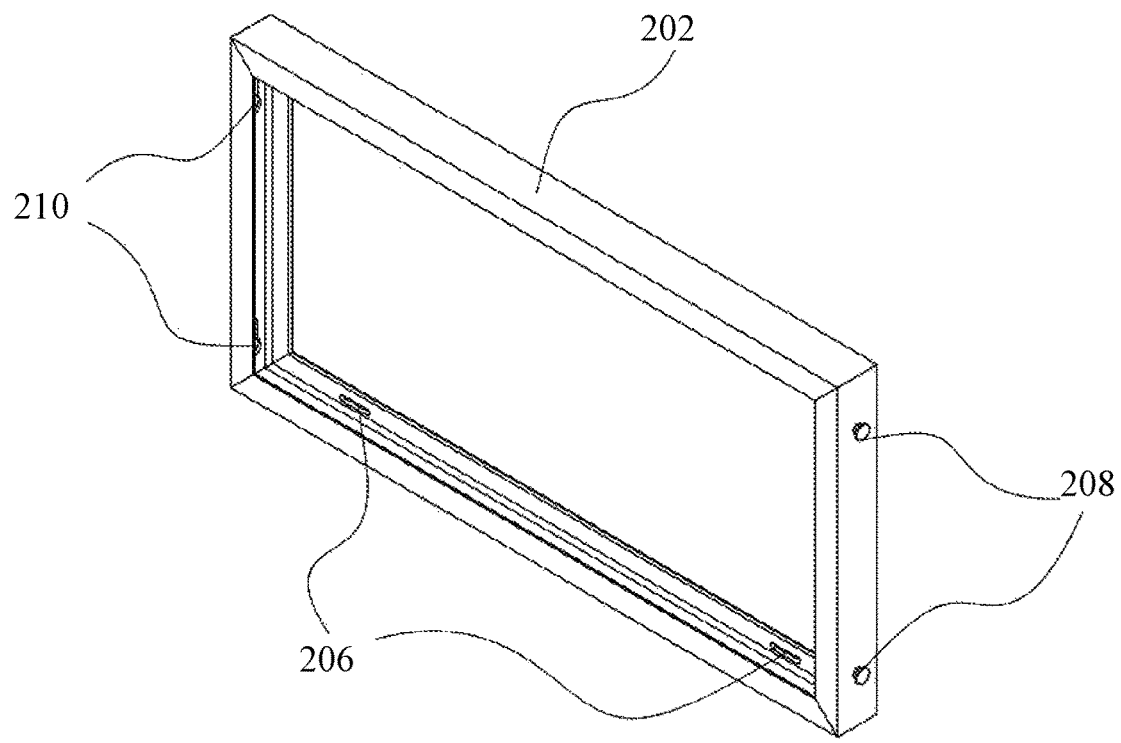
FIG. 10B is a front isometric illustrative view of one example of a sub-frame according to various embodiments of the present disclosure.

Referring to FIGS. 10A-10E, in some embodiments, the PV module 100 can be designed to couple to a sub-frame 202 for quick and simplified mounting on a structure. FIG. 10A provides an example front view of the frame 202, FIG. 10B provides an example isometric front view of the frame 202, FIG. 10C provides an example isometric rear view of the frame 202, and FIGS. 10D and 10E provide example side views of the frame 202. The frame 202 can be constructed from any combination of materials suitable for installation in an outdoor environment to withstand environmental conditions. For example, the frame 202 can be constructed from any combination of metal, plastic, or another suitable material. Similarly, the frame 202 can be sized and shaped to fit any combination of installations and housing any combination of components used in PV systems. For example, the frame 202 can be rectangular in shape sized to receive a PV module 100, as depicted in FIGS. 9A and 9B.

Referring to FIGS. 10A-10C, in some embodiments, the frame 102 can include front and rear lips extending substantially perpendicularly from the outside frame walls to couple to and/or provide a face for mounting a PV module 100. In some embodiments, at least one face of the frame 202 can include a plurality of mounting openings 206 designed to couple to the PV module 100. For example, the frame 202 can include a plurality of mounting openings 206 for coupling the frame 102 of the PV modules 100 to the frame 202 using a fastener, for example, a nut and bolt. Alternatively, the plurality of mounting openings 206 can be used to mount the frame 206 to a structure using for example, standoffs or other mounting mechanisms. The plurality of mounting openings 206 can be designed for any combination of sized and shapes designed to receive a coupling mechanism (e.g., a fastener). For example, as depicted in FIGS. 10B and 10C the plurality of mounting openings 206 can be elongate slots to provide flexible installation options. The frame 202 can also include other mechanisms for mounting the frame 202 to the PV modules 100, for example, using some combination of mechanical couplers, adhesives, welding, etc. In some embodiments, the frame 202 can also include mounting points on its opposing side for mounting for a structure.

Continuing with to FIGS. 10A-10E, in some embodiments, the frame 202 can include mechanical fasteners for coupling together multiple frames 202. In one example, the frame 202 can include male rivets 208 designed to slot and fit into female rivet slots 210. The combination of the male rivets 208 and the female rivet slots 210 enable frames 202 to be quickly mechanically coupled to one another. For example, the male rivets 208 can be inserted into the large opening within the female rivet slots 210 and slid down into the narrow portion of the female rivet slots 210 to lock into place.

Referring to FIGS. 11A and 11B, in some embodiments, multiple frames 202 can be coupled to one another to form an array of frames 202. Using frames 202 with male rivet slots 208 on one side and female rivet slots 210 on the opposing side, multiple frames 202 can be attached side by side. The use of sub-frames 202 can allows multiple PV modules 100 to be easily connected thereto together in a row during installation to create a PV solar array. Although FIGS. 11A and 11B depict a side by side configuration for a plurality of PV modules 100 being coupled together. The PV modules 100 can be designed to connect in any combination of orientations and configurations to create a PV solar array. For example, the PV modules 100 can include connectors 120, 140 on all four sides of the frame 102 to provide PV modules 100 that can be coupled in both the vertical orientation and/or the horizontal orientation. The PV modules 100 of the present disclosure can be scalable and adaptable to be installed on any combination of structures. For example, can be installed on buildings, vehicles, storage containers, etc.

Referring to FIGS. 12A-12D, in some embodiments, the frame 202 can be designed to receive and/or be coupled to one or more PV modules 100. The PV modules 100 can be secured to the frame 202 using any combination of mechanisms known in the art. For example, PV modules 100 can be coupled to a face of the frame 202 using or more fasteners through the plurality of mounting openings 106, for example, a nut and bolt. The frame 202 can also include other mechanisms for mounting the PV modules 100, for example, using some combination of mechanical couplers, adhesives, welding, etc. to couple the PV modules 100 on the face of the frame 202.

Figure 12A:
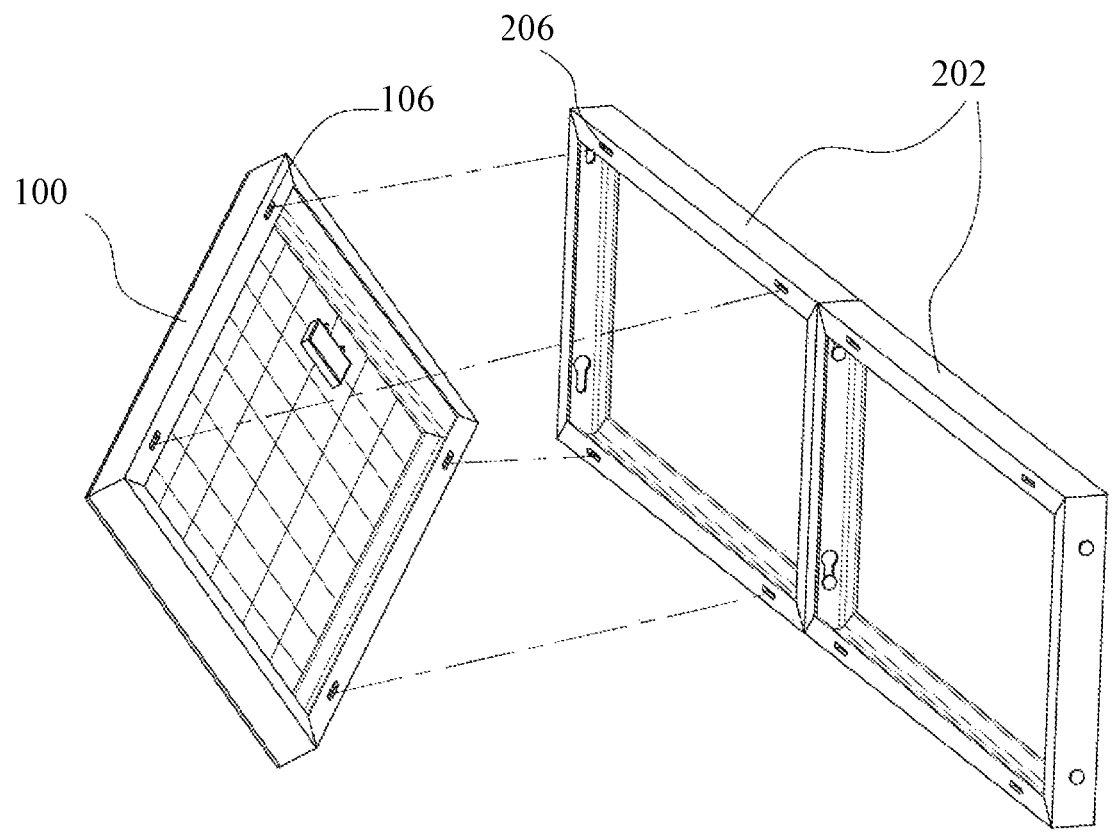
FIG. 12A is a front isometric illustrative view of one example of a PV module to be connected to a sub-frame according to various embodiments of the present disclosure.
Figure 12B:
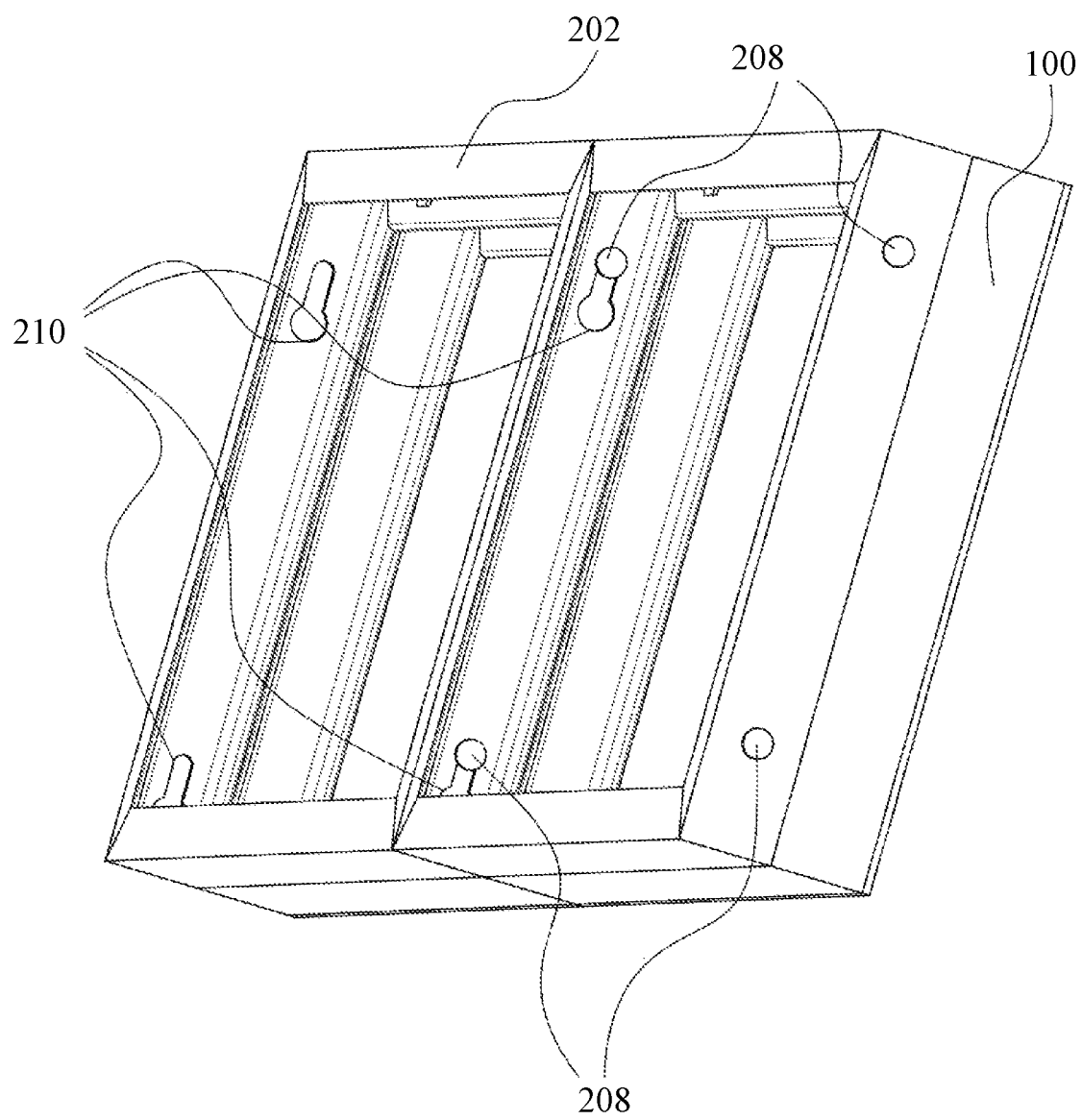
FIG. 12B is a rear illustrative view of one example of a PV module connected to a sub-frame according to various embodiments of the present disclosure.
Figure 12C:
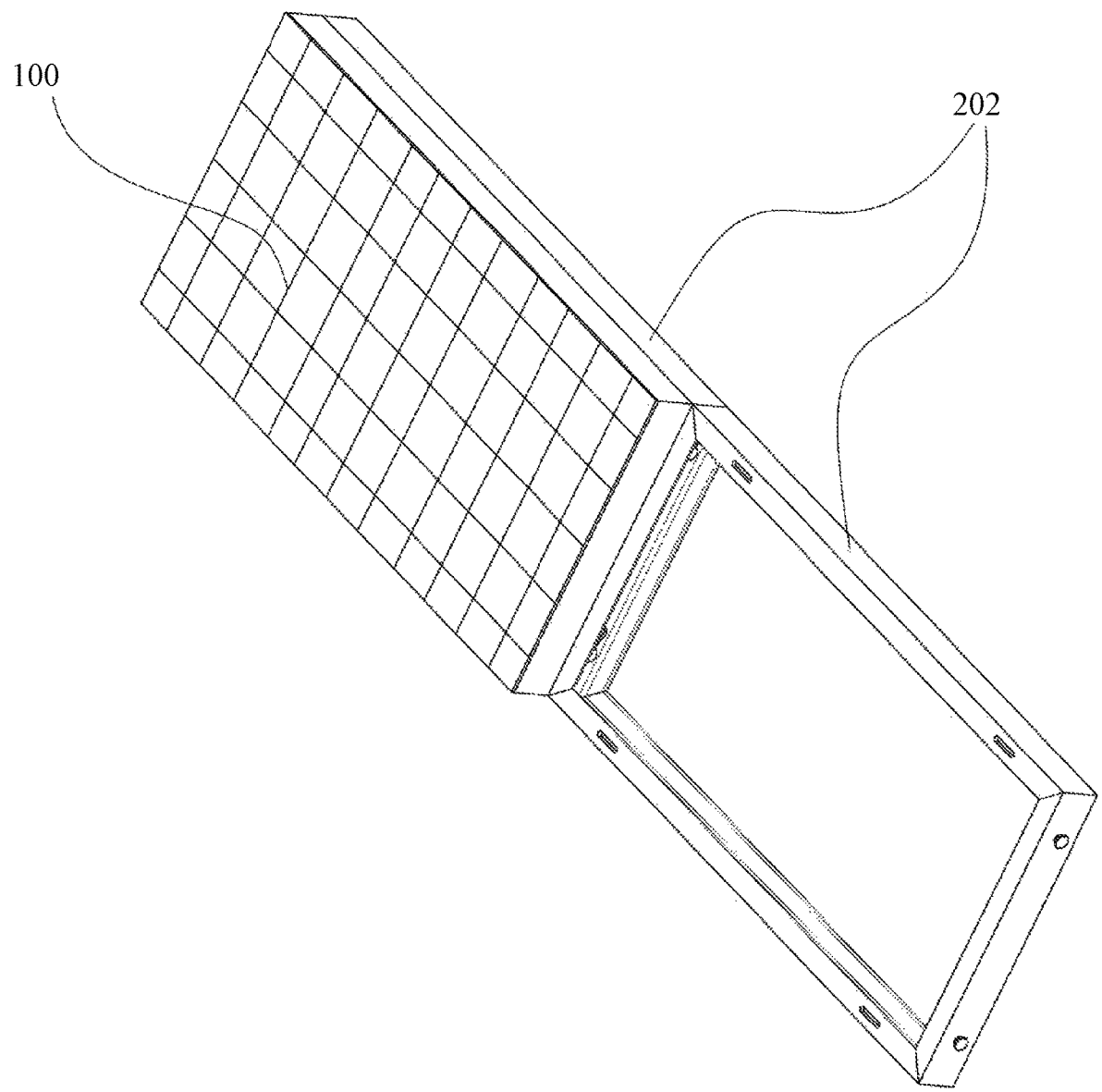
FIG. 12C is a front isometric illustrative view of one example of a PV module connected to a sub-frame according to various embodiments of the present disclosure.
Figure 12D:
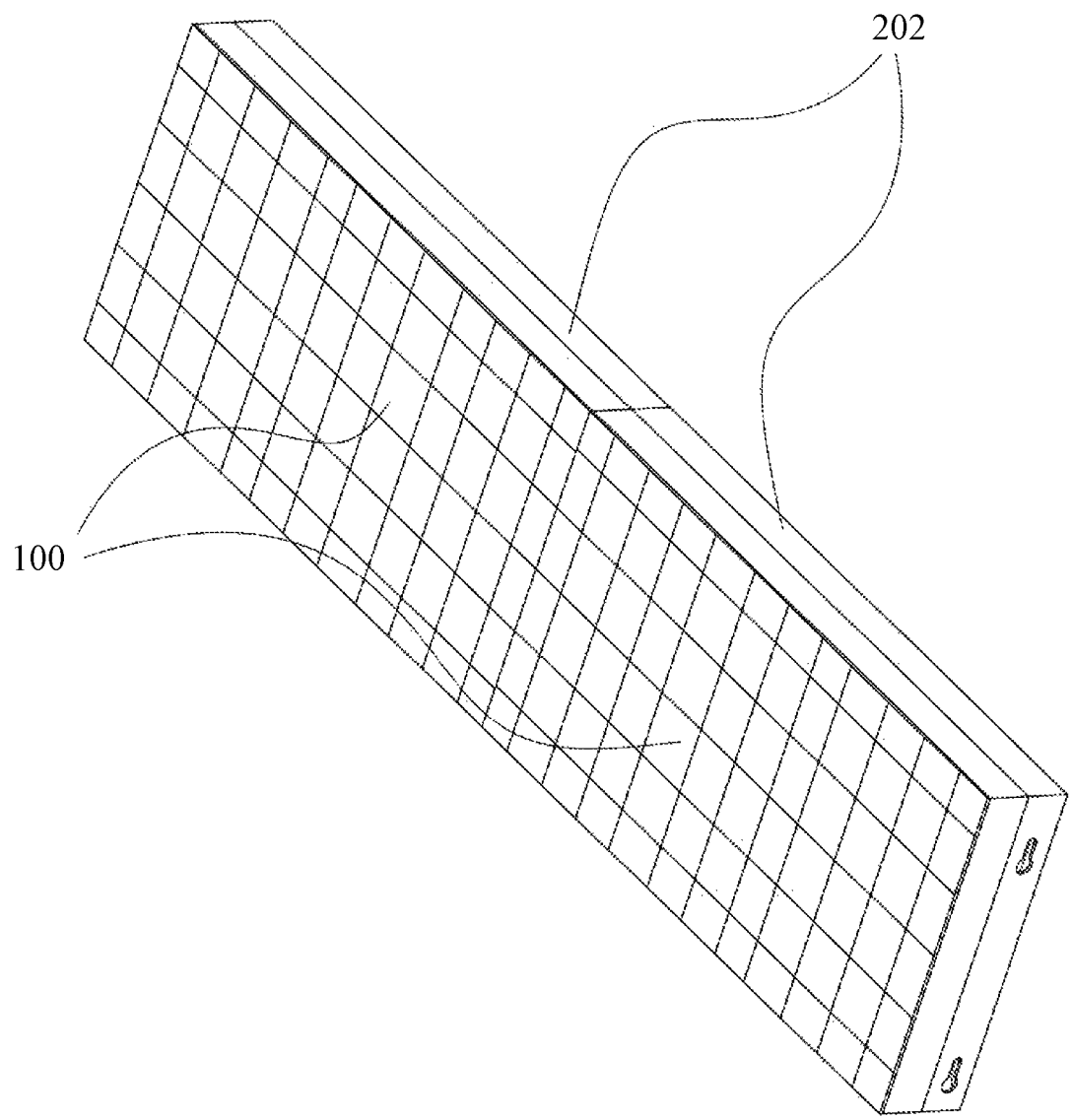
FIG. 12D is a front isometric illustrative view of one example of two PV modules connected to a sub-frame according to various embodiments of the present disclosure.

Referring to FIG. 12B, a rear view of multiple frames 202 with PV modules 100 coupled thereto and coupled together using male rivet slots 208 and female rivet slots 210. Referring to FIG. 12C a front view of multiple frames 202 coupled together with one PV module 100 coupled to one of the frames 202. Referring to FIG. 12D a front view of multiple frames 202 coupled together with each frame 202 having a PV module 100 coupled thereto.

In operation, when installed at a location, the PV modules 100 can be used alone or in combination to receive solar energy, convert the solar energy into electrical energy, and transport that energy for storage and/or usage internally and/or externally. In some embodiments, the magnetic connectors 120, 140 can also be used to transfer converted and/or stored energy between adjacent PV modules 100 and devices adjacent to the PV modules 100. In other words, the PV modules 100 can be electrically coupled to one another via the magnetic connectors 120, 140, as well as be coupled to other devices via the magnetic connectors 120, 140. For example, energy can be transferred over the magnetic connectors 120, 140 to any PV modules within an array as well as an external battery storage system, to one or more appliances requiring power, to a power grid, etc.

The PV modules 100 can be designed for the conversion and transference of electricity from one module to the next and ultimately to a storage unit or to a device that will consume the electricity using the various components discussed herein. In some embodiments, the conversion and transference process can include and converting solar energy received by the photovoltaic cells 152 within the photovoltaic cell casing 150. The converted solar energy received by the photovoltaic cells 152 can then be converted and/or transferred from the photovoltaic cell casing 150 to a battery casing 160 via the photovoltaic output junction 154 to the battery input 162 connection. Once the energy is received at the battery input 162, the energy can be routed by the battery casing 160 to any combination of destinations. For example, in one embodiment, the energy can be transferred to a battery 110 for storage. Energy received at the battery input 162 and/or stored in the battery 110 can then be transferred to a destination device, including an adjacent PV module 100 or another destination such as an appliance, external storage, the grid, etc. Any transfer to and from the PV modules 100 can occur over the one or more battery outputs 164 and through the magnetic connectors 120, 140 coupled thereto.

When transferring energy through the coupled female magnetic connector 120 or male magnetic connector 140 connected to the transferring PV module 100, they can be coupled to another device with a corresponding male magnetic connector 140 or female magnetic connector 120, or directly to the receiving device. For example, when transferring power to an adjacent PV module 100, the energy can be transferred from a first battery output 164 connected to a male magnetic connector 140 within the transferring PV module 100 to the female magnetic connector 120 (or vice versa) coupled thereto then the energy can be transferred from the female magnetic connector 120 connected to a second battery output 164 of the receiving PV module 100. As would be appreciated by one skilled in the art, the power conversions and transfers can be performed using any combination of devices, processing units, etc. known in the art As utilized herein, the terms "comprises" and "comprising" are intended to be construed as being inclusive, not exclusive. As utilized herein, the terms "exemplary", "example", and "illustrative", are intended to mean "serving as an example, instance, or illustration" and should not be construed as indicating, or not indicating, a preferred or advantageous configuration relative to other configurations. As utilized herein, the terms "about", "generally", and "approximately" are intended to cover variations that may existing in the upper and lower limits of the ranges of subjective or objective values, such as variations in properties, parameters, sizes, and dimensions. In one non-limiting example, the terms "about", "generally", and "approximately" mean at, or plus 10 percent or less, or minus 10 percent or less. In one non-limiting example, the terms "about", "generally", and "approximately" mean sufficiently close to be deemed by one of skill in the art in the relevant field to be included. As utilized herein, the term "substantially" refers to the complete or nearly complete extend or degree of an action, characteristic, property, state, structure, item, or result, as would be appreciated by one of skill in the art. For example, an object that is "substantially" circular would mean that the object is either completely a circle to mathematically determinable limits, or nearly a circle as would be recognized or understood by one of skill in the art. The exact allowable degree of deviation from absolute completeness may in some instances depend on the specific context. However, in general, the nearness of completion will be so as to have the same overall result as if absolute and total completion were achieved or obtained. The use of "substantially" is equally applicable when utilized in a negative connotation to refer to the complete or near complete lack of an action, characteristic, property, state, structure, item, or result, as would be appreciated by one of skill in the art.

Numerous modifications and alternative embodiments of the present disclosure will be apparent to those skilled in the art in view of the foregoing description. Accordingly, this description is to be construed as illustrative only and is for the purpose of teaching those skilled in the art the best mode for carrying out the present disclosure. Details of the structure may vary substantially without departing from the spirit of the present disclosure, and exclusive use of all modifications that come within the scope of the appended claims is reserved. Within this specification embodiments have been described in a way which enables a clear and concise specification to be written, but it is intended and will be appreciated that embodiments may be variously combined or separated without parting from the invention. It is intended that the present disclosure be limited only to the extent required by the appended claims and the applicable rules of law.

It is also to be understood that the following claims are to cover all generic and specific features of the invention described herein, and all statements of the scope of the invention which, as a matter of language, might be said to fall therebetween.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

What is claimed is:

1. A photovoltaic solar system, the system comprising:
   a frame designed to accommodate a solar panel for converting solar energy, the frame having a plurality of connection openings;
   at least one conductive connector designed to extend through an opening of the frame and be securely positioned therein so that it can be connected to another conductive connector similarly situated in an adjacent frame; and
   a pathway along the at least one conductive connector and the frame and through which the converted solar energy can be directed.

2. The system of claim 1, wherein the solar panel comprises a plurality of photovoltaic cells for collecting energy and a photovoltaic output junction wired to each of the plurality of photovoltaic cells.

3. The system of claim 2, further comprising a battery casing having at least one battery and a battery input coupled to the photovoltaic output junction for receiving energy from the photovoltaic output junction for storage in the at least one battery.

4. The system of claim 3, wherein the battery casing further comprises a plurality of battery outputs configured to couple to the at least one conductive connector.

5. The system of claim 1, wherein the frame comprises a plurality of mounting openings for mounting to a structure or a sub-frame.

6. The system of claim 5, wherein the sub-frame couples to the plurality of mounting openings of the frame.

7. The system of claim 6, wherein the sub-frame further comprises a a plurality of male rivets, and a plurality of female rivet slots.

8. The system of claim 1, wherein the at least one conductive connector is a female conductive connector, comprising:
   a head coupled to a shank;
   a magnetic material positioned within a recess of the head;
   a conductive material extending through the head and the shank; and
   an insulating material positioned between the conductive material and the head and the shank.

9. The system of claim 8, wherein:
   the shank is threaded and is substantially cylindrical in shape for removable insertion into a at least one connection opening of the plurality of connection openings; and
   a diameter of the head is greater than a diameter of a connection openings comprising an inserted female conductive connector such that the head limits a penetration of the at least one female conductive connector into the connection opening comprising the inserted female conductive connector.

10. The system of claim 1, wherein the at least one conductive connector is a male conductive connector, comprising:
    a head coupled to a shank;
    a conductive material extending through the head and the shank; and
    an insulating material positioned between the conductive material and the head and the shank.

11. The system of claim 10, wherein the at least one male conductive connector further comprises an O-ring positioned circumferentially around the head.

12. The system of claim 10, wherein the head further comprises a lip with a diameter greater than a diameter of a connection opening comprising an inserted male conductive connector such that the lip limits a penetration of the male conductive connector into the connection opening comprising the inserted male conductive connector.

13. The system of claim 12, wherein the shank is threaded and is substantially cylindrical in shape with a substantially flat surface for removable insertion into at least one connection opening.

14. The system of claim 13, further comprising a plurality D-shaped connection openings adapted to allow insertion of a conductive connector comprising the shank which is substantially cylindrical in shape with a substantially flat surface.

15. A photovoltaic solar system, the system comprising:
    a plurality of photovoltaic modules, each comprising:
       a solar panel for collecting energy and having a photovoltaic output junction; and
       a frame designed to accommodate a solar panel, the frame further having a plurality of connection openings; and
    at least one conductive connector extending through at least one connection opening and operatively connected to a photovoltaic output junction, the conductive connector further being connected to another conductive connector similarly situated in an adjacent frame.

\* \* \* \* \*